United States Patent
Jang et al.

(10) Patent No.: US 9,343,121 B2
(45) Date of Patent: May 17, 2016

(54) STORAGE DEVICE, INCLUDING NONVOLATILE MEMORY AND MEMORY CONTROLLER, OPERATING METHOD OF STORAGE DEVICE AND METHOD OF ACCESSING STORAGE DEVICE

(71) Applicant: SAMSUNG ELECTRONICS CO., LTD., Suwon-si, Gyeonggi-do (KR)

(72) Inventors: Sejeong Jang, Gyeonggi-do (KR); Kyungryun Kim, Seoul (KR); Nam-Ho Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/608,435

(22) Filed: Jan. 29, 2015

(65) Prior Publication Data
US 2015/0332780 A1   Nov. 19, 2015

(30) Foreign Application Priority Data
May 13, 2014  (KR) .......................... 10-2014-0057301

(51) Int. Cl.
| | |
|---|---|
| *G11C 7/04* | (2006.01) |
| *G11C 16/32* | (2006.01) |
| *G11C 16/04* | (2006.01) |
| *G11C 16/26* | (2006.01) |
| *G11C 16/34* | (2006.01) |
| *G11C 11/406* | (2006.01) |

(52) U.S. Cl.
CPC ............ *G11C 7/04* (2013.01); *G11C 11/40626* (2013.01); *G11C 16/0466* (2013.01); *G11C 16/26* (2013.01); *G11C 16/32* (2013.01); *G11C 16/3418* (2013.01)

(58) Field of Classification Search
CPC . G11C 7/04; G11C 16/3418; G11C 11/40626
See application file for complete search history.

(56) References Cited

U.S. PATENT DOCUMENTS

| | | |
|---|---|---|
| 7,679,133 B2 | 3/2010 | Son et al. |
| 7,743,203 B2 | 6/2010 | France |
| 7,773,413 B2 | 8/2010 | Shalvi |
| 7,796,424 B2 | 9/2010 | Happ et al. |
| 7,957,189 B2 | 6/2011 | Avraham et al. |
| 8,203,885 B2 | 6/2012 | Abiko et al. |
| 8,213,255 B2 | 7/2012 | Hemink et al. |
| 8,238,185 B2 | 8/2012 | Lee et al. |
| 8,248,856 B2 | 8/2012 | Goss et al. |
| 8,363,478 B1 | 1/2013 | Yang et al. |
| 8,467,249 B2 | 6/2013 | Katz et al. |
| 8,472,274 B2 | 6/2013 | Fai et al. |
| 8,542,537 B2 | 9/2013 | Parker |
| 8,553,466 B2 | 10/2013 | Han et al. |
| 8,559,235 B2 | 10/2013 | Yoon et al. |
| 8,576,651 B2 | 11/2013 | Scheuerlein et al. |
| 8,654,587 B2 | 2/2014 | Yoon et al. |
| 2010/0074014 A1 | 3/2010 | Dunga et al. |
| 2011/0233648 A1 | 9/2011 | Seol et al. |
| 2012/0163092 A1 | 6/2012 | Jung et al. |

*Primary Examiner* — Vanthu Nguyen
(74) *Attorney, Agent, or Firm* — F. Chau & Associates, LLC

(57) ABSTRACT

An operating method of a storage device is provided. The storage device includes a nonvolatile memory and a memory controller to control the nonvolatile memory. Temperature is detected. A current weighted time is calculated using the temperature. Data is read from the nonvolatile memory using a read voltage level which is adjusted based on the current weighted time. The current weighted time is determined according to an amount of charges leaked from memory cells storing the data at the temperature.

20 Claims, 26 Drawing Sheets

FIG. 11

PDT2

| | R1_ST (Cold) | R2_ST (Intermediate) | R3_ST (Hot) |
|---|---|---|---|
| TI1 | WET1 | WET2 (>WET1) | WET3 (>WET2) |
| TI2 (>TI1) | WET4 (>WET1) | WET5 (>WET2 & >WET4) | WET6 (>WET3 & >WET5) |
| TI3 (>TI2) | WET7 (>WET4) | WET8 (>WET5 & >WET7) | WET9 (>WET6 & >WET8) |

FIG. 12

PDT3

| | R1_ST (Cold) | R2_ST (Intermediate) | R3_ST (Hot) |
|---|---|---|---|
| R1_PE (Low) | WET1 | WET2 (>WET1) | WET3 (>WET2) |
| R2_PE (Intermediate) | WET4 (>WET1) | WET5 (>WET2 & >WET4) | WET6 (>WET3 & >WET5) |
| R3_PE (High) | WET7 (>WET4) | WET8 (>WET5 & >WET7) | WET9 (>WET6 & >WET8) |

| Addresses | Weighted Time Stamp |
|---|---|
| ADDR1 | WT1 |
| ADDR2 | WT2 (>WT1) |
| ADDR3 | WT3 (>WT2) |

FIG. 19

PDT6

| | R1_DIF | R2_DIF (>R1_DIF) | R3_DIF (>R3_DIF) |
|---|---|---|---|
| Compensation Coefficient | CC1 | CC2 | CC3 |

FIG. 21

| | R1_D | R2_D | R3_D |
|---|---|---|---|
| Weighted Time | WT1 | WT2 | WT3 |

PDT7

STORAGE DEVICE, INCLUDING NONVOLATILE MEMORY AND MEMORY CONTROLLER, OPERATING METHOD OF STORAGE DEVICE AND METHOD OF ACCESSING STORAGE DEVICE

CROSS-REFERENCE TO RELATED APPLICATION

This application claims priority under 35 U.S.C. §119 to Korean Patent Application No. 10-2014-0057301, filed May 13, 2014 in the Korean Intellectual Property Office, the disclosure of which is incorporated by reference herein in its entirety.

TECHNICAL FIELD

The present inventive concept relates to a storage device, an operating method of the storage device, and a method of accessing the storage device.

DISCUSSION OF RELATED ART

Storage devices store data according to a control of a host device, such as a computer, a smart phone, a smart pad, and so on. The storage devices may include a hard disk drive (HDD) and a semiconductor memory such as a solid state drive (SSD), a memory card, and so on. In particular, the storage device may include a device that stores data in a nonvolatile memory.

Nonvolatile memories may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and so on.

The degree of integration of a semiconductor memory has been increased to secure a capacity of storing more information. Such increase in the degree of integration of the semiconductor memory may cause an increase in an error rate— probability that data written to the semiconductor memory turns out to be in error. Thus, there is required a technique of reducing the error rate of the storage device including the semiconductor memory and increasing reliability.

SUMMARY

According to an exemplary embodiment of the present inventive concept, an operating method of a storage device is provided. The storage device includes a nonvolatile memory and a memory controller to control the nonvolatile memory. Temperature is detected. A current weighted time is calculated using the temperature. Data is read from the nonvolatile memory using a read voltage level which is adjusted based on the current weighted time. The current weighted time is determined according to an amount of charges leaked from memory cells storing the data at the temperature.

According to an exemplary embodiment of the present inventive concept, a storage device is provided. The storage device includes a temperature sensor, a nonvolatile memory; and a memory controller configured to control the nonvolatile memory. The memory controller calculates a current weighted time based on a variation in a temperature detected via the temperature sensor and reads data from the nonvolatile memory using a read voltage level adjusted according to the current weighted time.

According to an exemplary embodiment of the present inventive concept, a method of accessing a storage device including a nonvolatile memory is provided. Data is written to the nonvolatile memory. A weighted time is registered as a weighted time stamp of the data. The weighted time is periodically updated based on a temperature variation.

According to an exemplary embodiment of the present inventive concept, a method of operating a storage device including a nonvolatile memory device is provided. A first write request including a first data and a first address is received. The first data is buffered. A second write request including a second data and a second address is received. The second data is buffered. A write operation for the first write request and the second write request is performed at the same time using the first and the second data buffered. A first weighted time stamp associated with the write operation is registered.

BRIEF DESCRIPTION OF THE DRAWINGS

These and other features of the inventive concept will become more apparent by describing in detail exemplary embodiments thereof with reference to the accompanying drawings of which:

FIG. 11 shows a table used to calculate a weighted elapse time according to an exemplary embodiment of the inventive concept;

FIG. 12 shows a table used to calculate a weighted elapse time according to an exemplary embodiment of the inventive concept;

FIG. 19 is a table showing a method of compensating for a difference calculated by a memory controller according to an exemplary embodiment of the inventive concept;

FIG. 21 is a table showing an exemplary embodiment in which a memory controller calculates a weighted time WT according to a read-level difference;

DETAILED DESCRIPTION OF EXEMPLARY EMBODIMENTS

Figure 1:
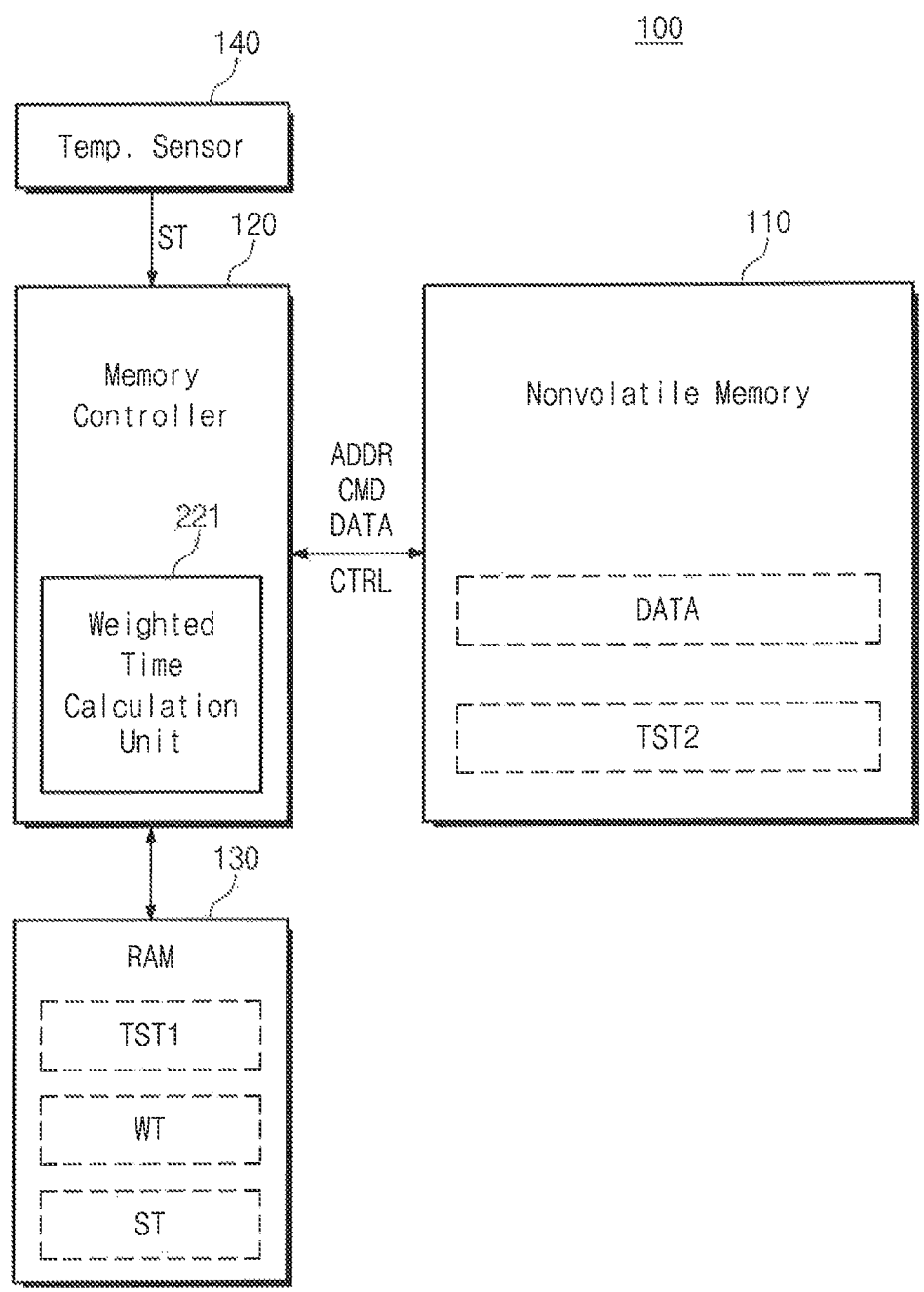
FIG. 1 is a block diagram illustrating a storage device according to ah exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram illustrating a storage device 100 according to an exemplary embodiment of the inventive concept. Referring to FIG. 1, a storage device 100 contains a nonvolatile memory 110, a memory controller 120, a random access memory (RAM) 130, and a temperature sensor 140. The storage device 100 may be a solid state drive (SSD), a memory card, or an embedded memory.

The nonvolatile memory 110 performs read, write, and erase operations according to a control of the memory controller 120. The nonvolatile memory 110 may include a flash memory. However, the inventive concept is not limited thereto. The nonvolatile memory 110 may contain at least one of nonvolatile memories, such as a Phase-change RAM (PRAM), a Magnetic RAM (MRAM), a Resistive RAM (RRAM), a Ferroelectric RAM (FRAM), and so on.

The memory controller 120 controls the nonvolatile memory 110 according to a request of an external host device or according to a predetermined schedule. For example, the memory controller 120 may control the nonvolatile memory 110 to perform a write, a read, or an erase operation.

The memory controller 120 may use the RAM 130 as a buffer memory, a cache memory, or a work memory. The memory controller 120 stores data received from the external host device in the RAM 130 and writes data stored in the RAM 130 to the nonvolatile memory 110. The memory controller 120 stores data read from the nonvolatile memory 110 in the RAM 130 and outputs data stored in the RAM 130 to the external host device. The memory controller 120 stores data read from the nonvolatile memory 110 in the RAM 130 and writes data stored in the RAM 330 to the nonvolatile memory 310.

The memory controller 120 stores data or codes necessary to manage the nonvolatile memory 110 in the RAM 130. For example, the memory controller 120 reads data or codes necessary to manage the nonvolatile memory 110 from the nonvolatile memory 110 and stores the data or codes in the RAM 130.

In case the storage device 100 is a solid state drive (SSD), the RAM 130 may be disposed outside the nonvolatile memory 110 and the memory controller 120. If the storage device 100 is an embedded device, the RAM 130 may be included in the memory controller 120.

The memory controller 120 contains a weighted time calculation unit 221. The weighted time calculation unit 221 receives a sensing temperature ST from the temperature sensor 140. For example, the weighted time calculation unit 221 may read the sensing temperature ST from the temperature sensor 140. The weighted time calculation unit 221 stores the received sensing temperature ST in the RAM 130.

The weighted time calculation unit 221 calculates a weighted time WT based on the sensing temperature ST. The weighted time calculation unit 221 stores the weighted time WT in the RAM 130.

The memory controller 120 writes or reads data to or from the nonvolatile memory 110 using the weighted time WT stored in the RAM 130. For example, the memory controller 120 may produce a weighted time stamp when writing data in the nonvolatile memory 110. The weighted time stamps may be registered in a first time stamp table TST1. The memory controller 120 stores the first time stamp table TST1 in the RAM 130 for management. The memory controller 120 may store the first time stamp table TST1 in a second time stamp table TST2 of the nonvolatile memory 110.

For example, reading the data from the nonvolatile memory 110, the memory controller 120 reads the weighted time stamp from the first time stamp table TST1 stored in the RAM 130 and a weighted time WT from the RAM 130. The memory controller 120 reads data using the weighted time stamp and the weighted time WT.

The weighted time calculation unit 221, the sensing temperature ST, the weighted time WT, the weighted time stamp, and the time stamp tables TST1 and TST2 will be described later.

The RAM 130 may include at least one of random access memories, such as DRAM (Dynamic RAM), SRAM (Static RAM), SDRAM (Synchronous DRAM), PRAM (Phase-change RAM), MRAM (Magnetic RAM), RRAM (Resistive RAM), FeRAM (Ferroelectric RAM), and so on.

Figure 2:
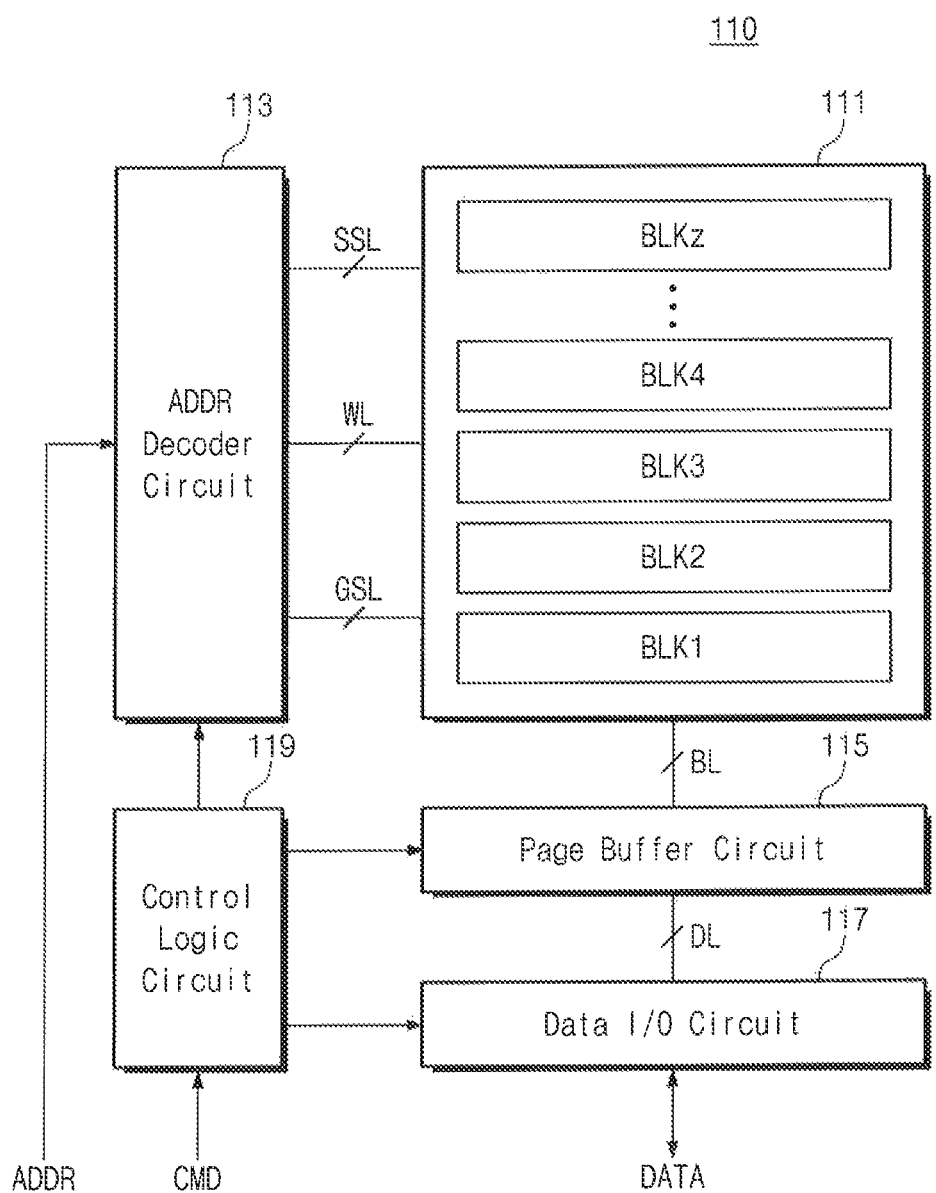
FIG. 2 is a block diagram illustrating a nonvolatile memory according to an exemplary embodiment of the inventive concept.

FIG. 2 is a block diagram illustrating a nonvolatile memory 110 according to an exemplary embodiment of the inventive concept. Referring to FIG. 2, a nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 to BLKz, each of which has a plurality of memory cells. Each memory block is connected to the address decoder circuit 113 through at least one string selection line SSL, a plurality of word lines WL, and at least one ground selection line GSL. The memory cell array 111 is connected to the page buffer circuit 115 through a plurality of bit lines BL. The memory blocks BLK1 to BLKz may be connected in common to the plurality of bit lines BL. Memory cells of the memory blocks BLK1 to BLKz may have the same structure.

The address decoder circuit 113 is connected to the memory cell array 111 through a plurality of ground selection lines GSL, the plurality of word lines WL, and a plurality of string selection lines SSL. The address decoder circuit 113 operates according to a control of the control logic circuit 119. The address decoder circuit 113 receives an address from a memory controller 220 (refer to FIG. 1). The address decoder circuit 113 decodes an input address ADDR, and it controls voltages to be applied to the word lines WL according to the decoded address. For example, in a programming operation, the address decoder circuit 113 applies a pass voltage to word lines WL according to a control of the control logic circuit 119. In a programming operation, the address decoder circuit 113 further applies a program voltage to a word line, selected by an address ADDR, from among the word lines WL according to a control of the control logic circuit 119.

The page buffer circuit 115 is connected to the memory cell array 111 through the bit lines BL. The page buffer circuit 115 is connected to the data input/output circuit 117 through a plurality of data lines DL. The page buffer circuit 115 operates according to a control of the control logic circuit 119.

The page buffer circuit 115 holds data to be programmed at memory cells of the memory cell array 111 or data read from memory cells thereof. During a program operation, the page buffer circuit 115 stores data to be stored in memory cells. The page buffer circuit 115 drives the stored data through the plurality of bit lines BL to the memory cell array 111. The page buffer circuit 115 functions as a write driver in a program operation. During a read operation, the page buffer circuit 115 senses voltages on the bit lines BL and stores sensing results. The page buffer circuit 115 functions as a sense amplifier in a read operation.

The data input/output circuit 117 is connected to the page buffer circuit 115 through the data lines DL. The data input/output circuit 117 exchanges data with the memory controller 120 (refer to FIG. 1).

The data input/output circuit 117 temporarily stores data which the memory controller 120 provides, and transfers it to the page buffer circuit 115. The data input/output circuit 117 temporarily stores data transferred from the page buffer circuit 115 and transfers it to the memory controller 120. The data input/output circuit 117 functions as a buffer memory.

The control logic circuit 119 receives a command CMD from the memory controller 120. The control logic circuit 119 decodes the received command and controls an overall operation of the nonvolatile memory 110 according to the decoded command. The control logic circuit 119 further receives various control signals and voltages from the memory controller 120 (refer to FIG. 1).

Figure 3:
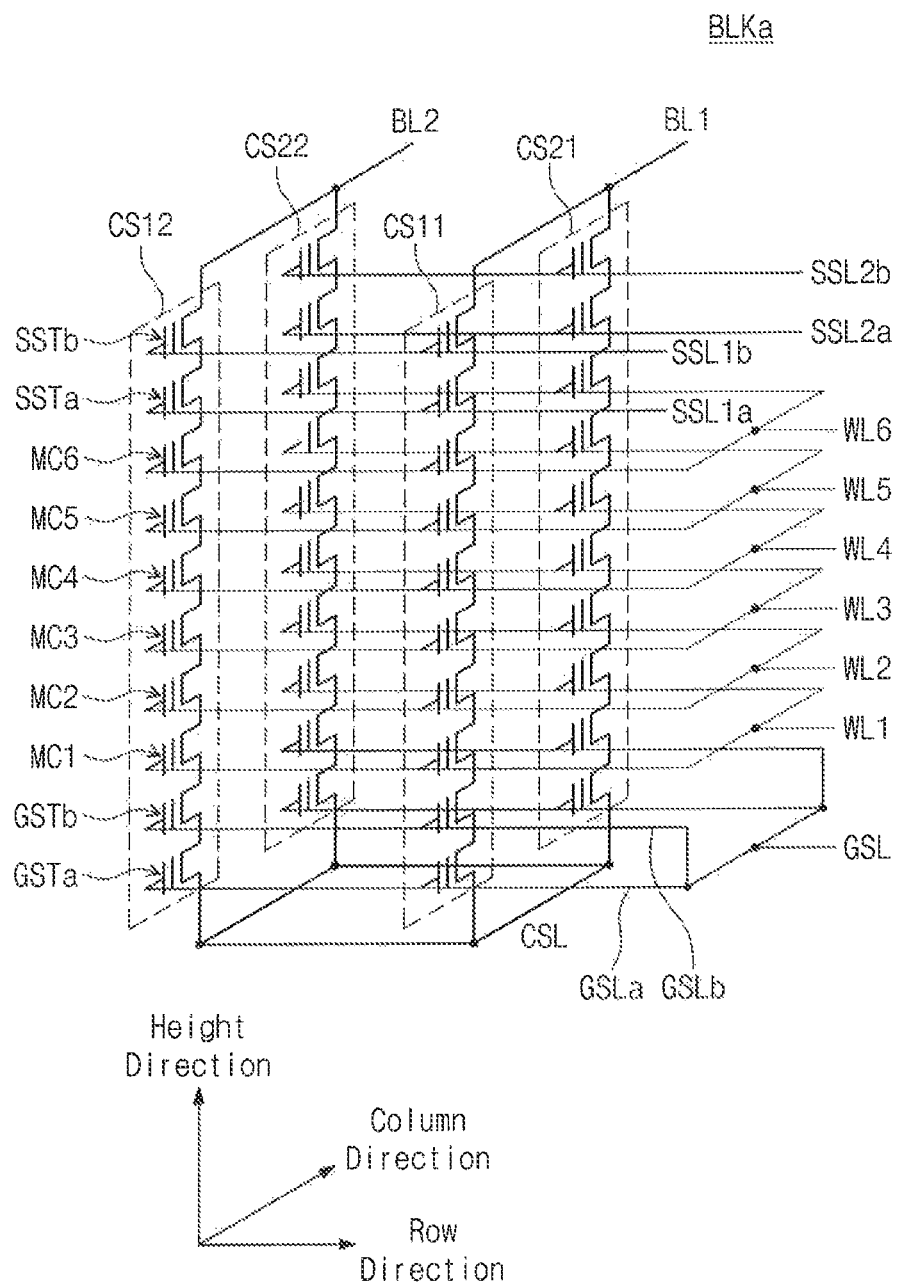
FIG. 3 is a circuit diagram illustrating a memory block according to an exemplary embodiment of the inventive concept.

FIG. 3 is a circuit diagram illustrating a memory block BLKa according to an exemplary embodiment of the inventive concept. Referring to FIG. 3, a memory block BLKa includes a plurality of cell strings CS11 to CS21 and CS12 to CS22. The plurality of cell strings CS11 to CS21 and CS12 to CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string includes a plurality of cell transistors. In each cell string, the cell transistors include ground selection transistors GSTa and GSTb, memory cells MC1 to MC6, and string selection transistors SSTa and SSTb. The ground selection transistors GSTa and GSTb, memory cells MC1 to MC6, and string selection transistors SSTa and SSTb of each cell string are stacked in a height direction perpendicular to a plane (e.g., plane above a substrate of the memory block BLKa) on which the cell strings CS11 to CS21 and CS12 to CS22 are arranged along rows and columns.

Each cell transistor may be formed of a charge-trap-type cell transistor of which a threshold voltage varies with the amount of charge trapped in its insulation film.

The lowermost ground selection transistors GSTa are connected in common to a common source line CSL.

The ground selection transistors GSTa and GSTb of the plurality of cell strings CS11 to CS21 and CS12 to CS22 are connected in common to a ground selection line GSL.

In exemplary embodiments, ground selection transistors positioned at the same height (or, order) may be connected to the same ground selection line, and ground selection transistors positioned at different heights (or, orders) may be connected to different ground selection lines. For example, the ground selection transistors GSTa positioned at a first height are connected in common to a first ground selection line GSLa, and the ground selection transistors GSTb positioned at a second height are connected in common to a second ground selection line GSLb.

In exemplary embodiments, ground selection transistors in the same row may be connected to the same ground selection line, and ground selection transistors in different rows may be connected to different ground selection lines. For example, the ground selection transistors GST of the cell strings CS11 and CS12 in the first row are connected in common to the first ground selection line GSLa, and the ground selection transistors GSTb of the cell strings CS11 and CS12 in the second row are connected in common to the second ground selection line GSLb.

Word lines WL1 to WL6 are in common connected memory cells that are placed at the same height (or, order) from the substrate (or, the ground selection transistors GST). Memory cells that are placed at different heights (or, orders) are connected to different word lines WL1 to WL6. For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In exemplary embodiments, string selection transistors positioned at the same height (or order) may be connected in common to the same string selection lines, and string selection transistors positioned at different heights (or order) may be connected to different string selection lines. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

String selection transistors SSTa and SSTb positioned at different heights are connected to the different string selection lines SSL1a and SSL2a. For example, the second string selection transistors SSTb of the cell strings CS11 and CS12 are connected in common to the string selection line SSL1b, and the first string selection transistors SSTa of the cell strings CS21 and CS22 are connected in common to the string selection line SSL2a.

Cell string selection transistors included in different rows may be connected to different strings selection lines. String selection transistors, having the same height (or, order), of cell strings in the same row are connected to the same string selection line. String selection transistors, having different heights (or, orders), of cell strings in different rows are connected to different string selection lines.

In exemplary embodiments, string selection transistors of cell strings in the same row are connected in common to a string selection line. For example, string selection transistors SSTb of cell strings CS11 and CS12 in the first row are connected in common to a string selection line SSL_1b, and string selection transistors SSTa of cell strings CS21 and CS22 in the second row are connected in common to another string selection line SSL_1a.

Columns of the cell strings CS11 to CS21 and CS12 to CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

For the convenience of description, the memory block BLKa of FIG. 3 is provided. However, the inventive concept is not limited thereto. For example, the number of rows of cell strings may increase or decrease, and the number of string or ground selection lines and the number of cell strings connected to a bit line may increase or decrease.

The number of cell strings may increase or decrease. If the number of cell strings changes, the number of bit lines connected to columns of cell strings and the number of cell strings connected to a string selection line may change.

A height of the cell strings may increase or decrease. For example, the number of ground selection transistors, memory cells, or string selection transistors that are stacked in each cell string may increase or decrease.

In exemplary embodiments, a write and a read operation may be performed in a row, which may be referred to a page. For example, memory cells of the cell strings CS11 to CS21 and CS12 to CS22 in the same page may be selected through the string selection lines SSL1a, SSL1b, SSL2a, and SSL2b.

For example, each page may be selected by a word line. In the cell strings CS11 to CS21 and CS12 to CS22, memory cells connected to a selected word line (row) may be programmed at the same time.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
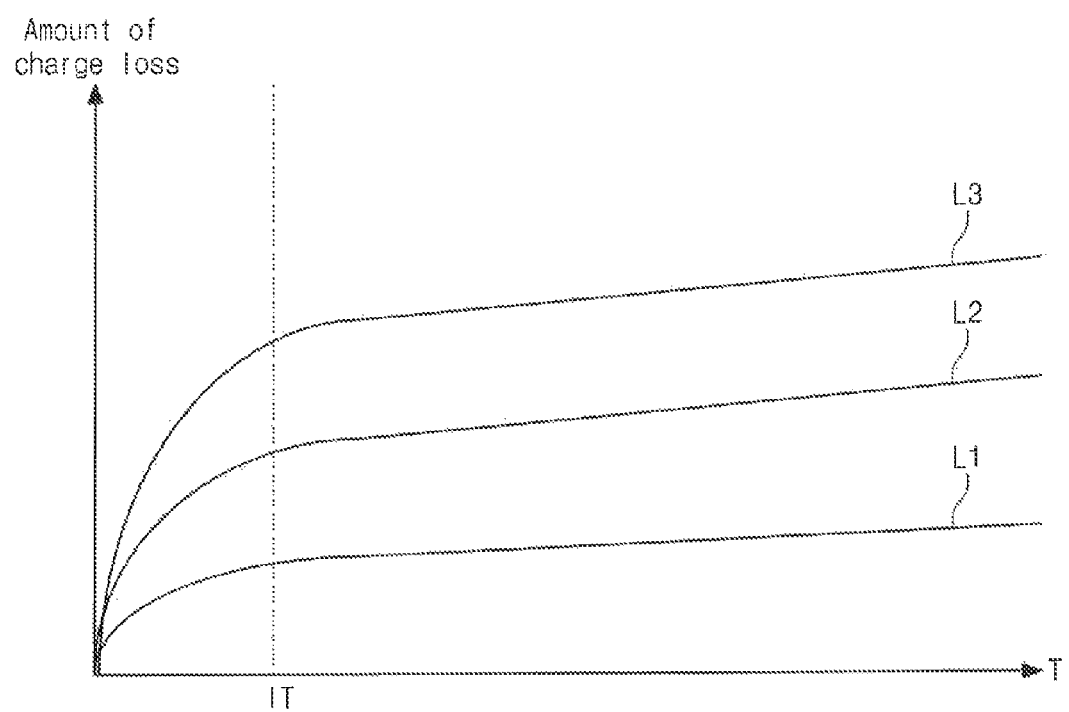
FIG. 4 is a graph showing the amount of charge leaked from memory cells of a nonvolatile memory with time and temperature.
Figure 5:
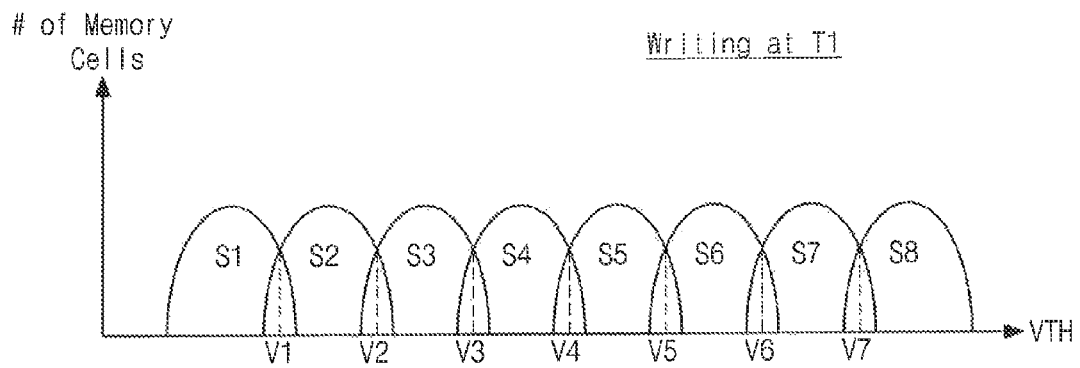
FIG. 5 shows threshold voltages of memory cells of a nonvolatile memory.
Figure 5:
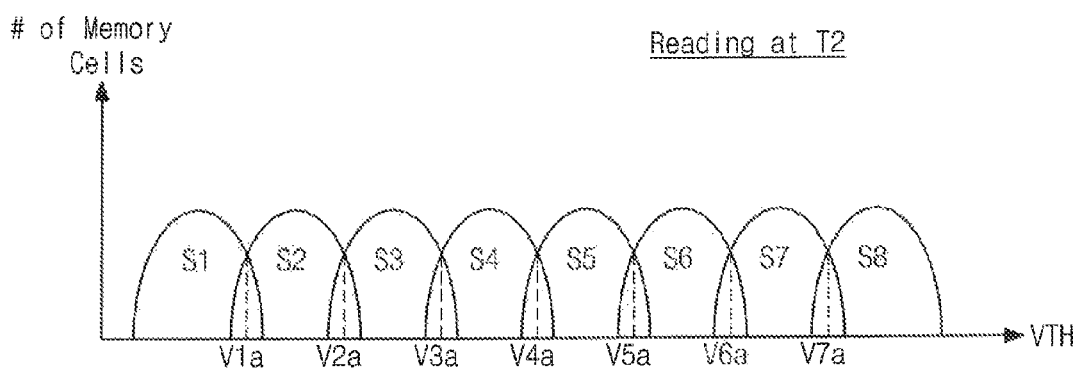
Figure 5:
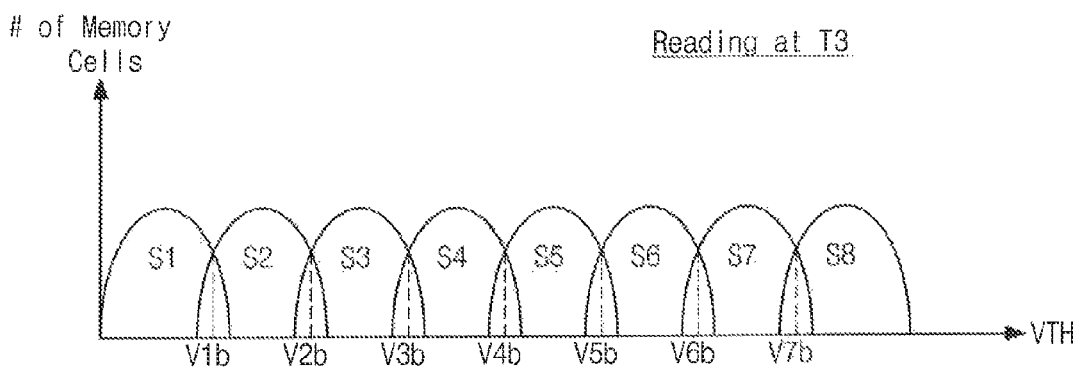

FIG. 4 is a graph showing an amount of charge leaked from memory cells MC of a nonvolatile memory 110 with time and temperature. In FIG. 4, the abscissa represents time T, and the ordinate represents the amount of charge leaked. FIG. 5 shows threshold voltage distributions of memory cells MC of a nonvolatile memory 110.

Referring to FIGS. 2 to 5, memory cells MC of a nonvolatile memory 110 store data based on the amount of charge (e.g., electrons). For example, the threshold voltage of a memory cell MC may vary with the amount of charge accumulated or trapped in the memory cell MC of the nonvolatile memory 110. The threshold voltage of the memory cell MC represents a value of the data bit stored in the memory cell MC. An operation of writing data in a memory cell MC may be achieved by setting a threshold voltage of the memory cell MC within a predetermined range. An operation of reading data from a memory cell may be achieved by determining a threshold voltage range to which a threshold voltage of the memory cell MC belongs.

As illustrated in FIG. 5, at first time T1, data is written at memory cells MC such that each memory cell has one of first to eight states S1 to S8. Data written at the first time T1 may be read using first to seventh voltages V1 to V7.

When a threshold voltage of a memory cell is lower than the first voltage V1, data written at the memory cell may be read as having a value corresponding to the first state S1. In case a threshold voltage of a memory cell is between the first voltage V1 and the second voltage V2, data written at the memory cell may be read as having a value corresponding to the second state S2. In a case where a threshold voltage of a memory cell is between the second voltage V2 and the third voltage V3, data written at the memory cell may be read as having a value corresponding to the third state S3. If a threshold voltage of a memory cell is between the third voltage V3 and the fourth voltage V4, data written at the memory cell may be read as having a value corresponding to the fourth state S4. When a threshold voltage of a memory cell is between the fourth voltage V4 and the fifth voltage V5, data written at the memory cell may be read as having a value corresponding to the fifth state S5. If a threshold voltage of a memory cell is between the fifth voltage V5 and the sixth voltage V6, data written at the memory cell may be read as having a value corresponding to the sixth state S6. In case a threshold voltage of a memory cell is between the sixth voltage V6 and the seventh voltage V7 data written at the memory cell may be read as having a value corresponding to the seventh state S7. When a threshold voltage of a memory cell is greater than the seventh voltage V7, data written at the memory cell will be read as having a value corresponding to the eighth state S8.

In FIG. 4, memory cells MC of the nonvolatile memory 110 may lose charge with time. In FIG. 4, a first line L1 represents the amount of charge leaked from memory cells of the nonvolatile memory 110, for example, the average amount of charge leaked therefrom, when a temperature of the nonvolatile memory 110 or an ambient temperature of the nonvolatile memory 110 is a first temperature (e.g., cold). A second line L2 represents the amount of charge leaked from memory cells of the nonvolatile memory 110, for example, the average amount of charge leaked therefrom, when a temperature of the nonvolatile memory 110 or an ambient temperature of the nonvolatile memory 110 is a second temperature (e.g., room temperature) higher than the first temperature. A third line L3 represents the amount of charge leaked from memory cells of the nonvolatile memory 110, for example, the average amount of charge leaked therefrom, when a temperature of the nonvolatile memory 110 or an ambient temperature of the nonvolatile memory 110 is a third temperature (e.g., hot) higher than the second temperature.

The amount of charge leaked from memory cells MC of the nonvolatile memory 110 may increase as time is elapsed. In the nonvolatile memory 110, the amount of charge leaked may increase as temperature increases. The amount of charge leaked until an initial time IT after data is written at memory cells may be greater than that after the initial time IT.

A temperature of the nonvolatile memory 110 or an ambient temperature thereof may vary with an operating state of the nonvolatile memory 110 or an environment where the nonvolatile memory 110 is put. For example, a temperature of the nonvolatile memory 110 or an ambient temperature thereof may be low when the nonvolatile memory 110 is in an idle state. A temperature of the nonvolatile memory 110 or an ambient temperature thereof may be high when the nonvolatile memory 110 is in a busy state. A temperature of the nonvolatile memory 110 or an ambient temperature thereof may become high when the nonvolatile memory 110 is put in a high-temperature area. A temperature of the nonvolatile memory 110 or an ambient temperature thereof may become low when the nonvolatile memory 110 is put in a low-temperature area.

When charge is leaked from memory cells MC of the nonvolatile memory 110, an error will occur to data written to the memory cells MC. For example, as illustrated in FIG. 5, a read operation may be performed at second time T2. Charge may be leaked from the memory cells MC between time T1 and time T2 such that threshold voltages of the memory cells MC are shifted to lower threshold voltages. It is assumed that first to seventh voltages V1a to V7a may be optimal voltages for reading data at time T2 which was written to memory cells at time T1. Levels of the first to seventh voltages V1a to V7a are lower than those of the first to seventh voltages V1 to V7. For example, optimal voltages for reading data may be voltages that allow data to be read with the lowest error rate.

Also, as illustrated in FIG. 5, a read operation may be performed at third time T3. Charge may be leaked from the memory cells MC between time T1 and time T3 such that threshold voltages of the memory cells MC are shifted to lower threshold voltages. First to seventh voltages V1b to V7b may be optimal voltages for reading data at time T3 which was written to memory cells at time T1. Levels of the first to seventh voltages V1b to V7b are lower than those of the first to seventh voltages V1a to V7a.

As described above, optimal voltages for reading data from memory cells MC may be shifted according to the amount of charge leaked from the memory cells MC. A read error may occur when a read operation is carried out not using the optimal voltages adjusted according to the amount of charge leaked from the memory cells MC. The amount of charge leaked from memory cells MC may be affected by a temperature as well as the lapse of time. To prevent a read error due to charge loss, a storage device 100 according to an exemplary embodiment of the inventive concept may take account of the amount of charge leaked from memory cells MC when reading data stored in the memory cells MC. The storage device 100 may calculate the amount of charge leaked, based on a temperature variation as well as an elapsed time after data is written to memory cells MC. The storage device 100 may read data written to memory cells MC using an optimal voltages adjusted according to the amount of charge leaked.

Figure 6:
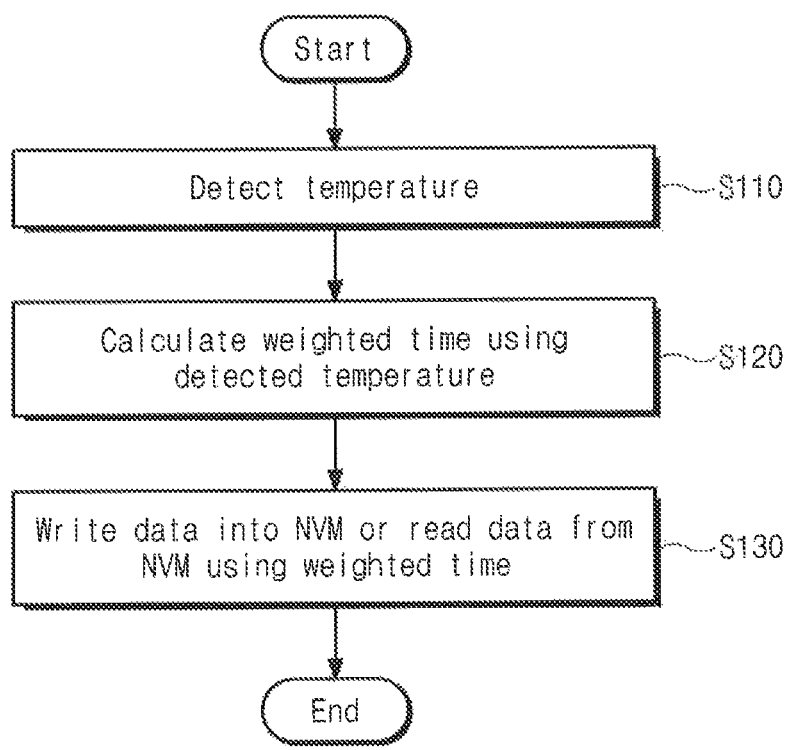
FIG. 6 is a flow chart illustrating an operating method of a storage device according to an exemplary embodiment of the inventive concept.

FIG. 6 is a flow chart illustrating an operating method of a storage device according to an exemplary embodiment of the inventive concept. Referring to FIGS. 1 and 6, in step S110, the storage device 100 detects a temperature. For example, the storage device 100 may detect a temperature of the nonvolatile memory 110 or an ambient temperature of the nonvolatile memory 110 using the temperature sensor 140.

In step S120, the storage device 100 calculates a weighted time using the detected temperature. The weighted time may be an elapse time based on the detected temperature. The storage device 100 calculates the weighted time periodically. Whenever the weighted time is calculated, the storage device calculates a weighted elapse time, which elapses during a weighted-time calculation period, based on the detected temperature. The weighted elapse time may increase in proportion to the detected temperature. For example, as the detected temperature become high, the weighted time may elapse fast. The weighted time may be a time that is normalized in such a way that the amount of charge leaked from memory cells according to a temperature is utilized.

In step S130, writing of data to the nonvolatile memory 110 or reading of data from the nonvolatile memory 110 is made using the weighted time. For example, based on a variation in a temperature with time, the storage device 100 may read or write data from or to the nonvolatile memory 110. The amount of charge varying with the lapse of time and a temperature variation may be employed to perform a read and a write operation of the nonvolatile memory 110 to increase reliability of the storage device 100.

Figure 7:
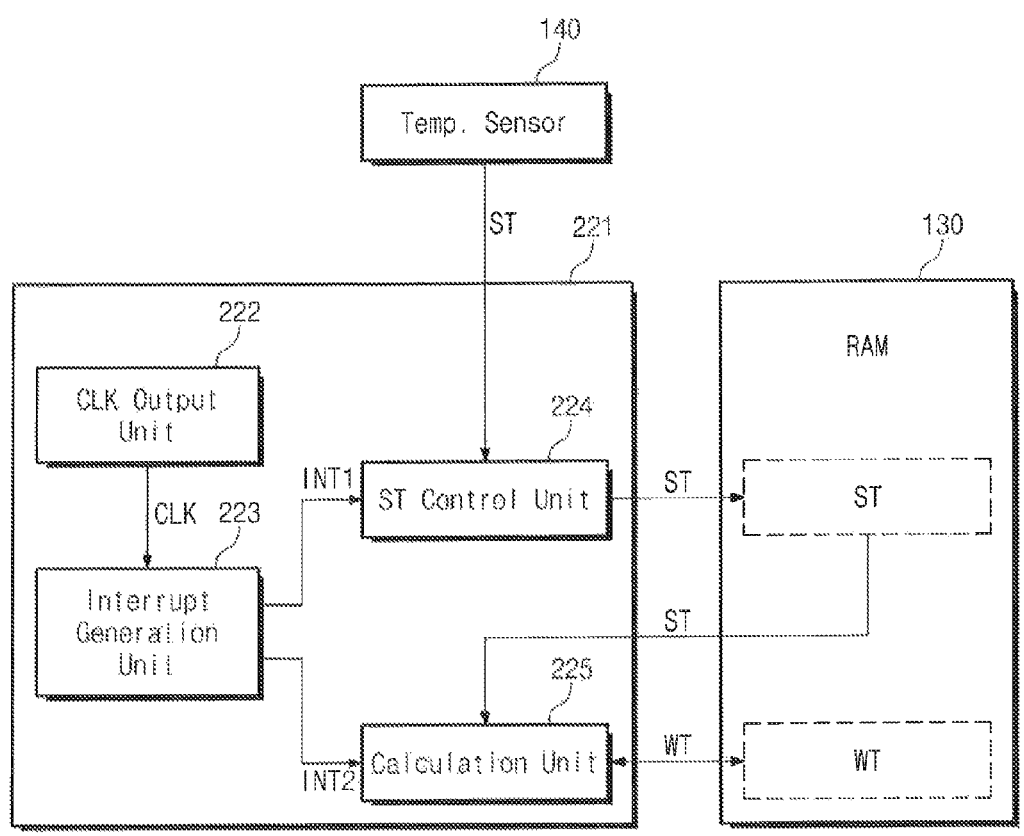
FIG. 7 is a block diagram illustrating a weighted time calculation unit according to an exemplary embodiment of the inventive concept.

FIG. 7 is a block diagram illustrating a weighted time calculation unit 221, a RAM 130 and a temperature sensor 140 associated with the weighted time calculation unit 221, according to an exemplary embodiment of the inventive concept. The weighted time calculation unit 221 contains a clock signal output unit 222, an interrupt generation unit 223, a sensing temperature control unit 224, and a calculation unit 225.

The clock signal output unit 222 outputs a clock signal CLK. The clock signal CLK may be a signal that oscillates periodically. The clock signal output unit 222 may output an external clock signal received from an external device as the clock signal CLK without processing. Alternatively, the clock signal output unit 222 may process the external clock signal to output the clock signal CLK.

The interrupt generation unit 223 receives the clock signal CLK from the clock signal output unit 222. The interrupt generation unit 223 outputs first and second interrupt signals INT1 and INT2 in response to the clock signal CLK. For example, the interrupt generation unit 223 may output the first interrupt signal INT1 at a first period of the clock signal CLK. For example, the interrupt generation unit 223 outputs the first interrupt signal INT1 every clock edge where the clock signal changes from low to high or from high to low. The interrupt generation unit 223 may output the second interrupt signal INT2 at a second period of the clock signal CLK. For example, the interrupt generation unit 223 outputs the second interrupt signal INT2 every clock edge where the clock signal changes from low to high or from high to low. The second period may be substantially the same with the first period. Alternatively, the second period may be different from the first period.

The sensing-temperature control unit 224 reads a sensing temperature ST from a temperature sensor 140 in response to the first interrupt signal INT1. The sensing-temperature control unit 224 stores the sensing temperature ST from the temperature sensor 140 in the RAM 130 of FIG. 1.

The calculation unit 225 reads the sensing temperature ST and the weighted time WT from the RAM 130 in response to the second interrupt signal INT2. Based on the sensing temperature ST and the weighted time WT, the calculation unit 225 updates the weighted time WT that is stored in the RAM 130. For example, the calculation unit 225 calculates a new weighted time WT using the sensing temperature ST, a fixed time related with the second interrupt signal INT2 (e.g., the second period of the second interrupt signal INT2), and the weighted time WT and stores the new weighted time WT in the RAM 130.

Figure 8:
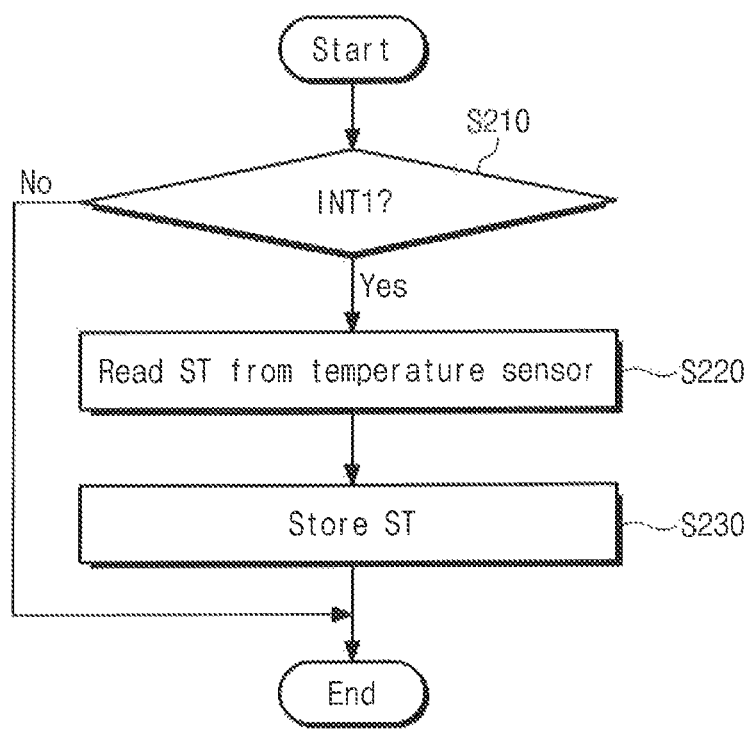
FIG. 8 is a flow chart showing a method of detecting a sensing temperature according to an exemplary embodiment of the inventive concept.

FIG. 8 is a flow chart showing a method of detecting a sensing temperature ST, according to an exemplary embodiment of the inventive concept. Referring to FIGS. 7 and 8, in step S210, the sensing-temperature control unit 224 determines whether the first interrupt signal INT1 is activated. When the first interrupt signal INT1 is determined as being not activated, the method ends. If the first interrupt signal INT1 is determined as activated, in step S220, the sensing-temperature control unit 224 reads a sensing temperature ST from the temperature sensor 140. In step S230, the sensing-temperature control unit 140 stores or updates the sensing temperature ST in the RAM 130. For example, the sensing temperature ST may be stored in a predetermined location of the RAM 130. In case a sensing temperature ST is previously stored in the RAM 130, the sensing temperature ST previously stored in the RAM 130 may be updated (e.g., overwritten) by a new sensing temperature ST.

In an exemplary embodiment, the first interrupt signal INT1 may be activated with a period of one second. For example, a sensing temperature ST stored in the RAM 130 may be updated every second. A temperature of the nonvolatile memory 110 or an ambient temperature of the nonvolatile memory 110 may be monitored every second and may be stored in the RAM 130.

Figures 9, 10:
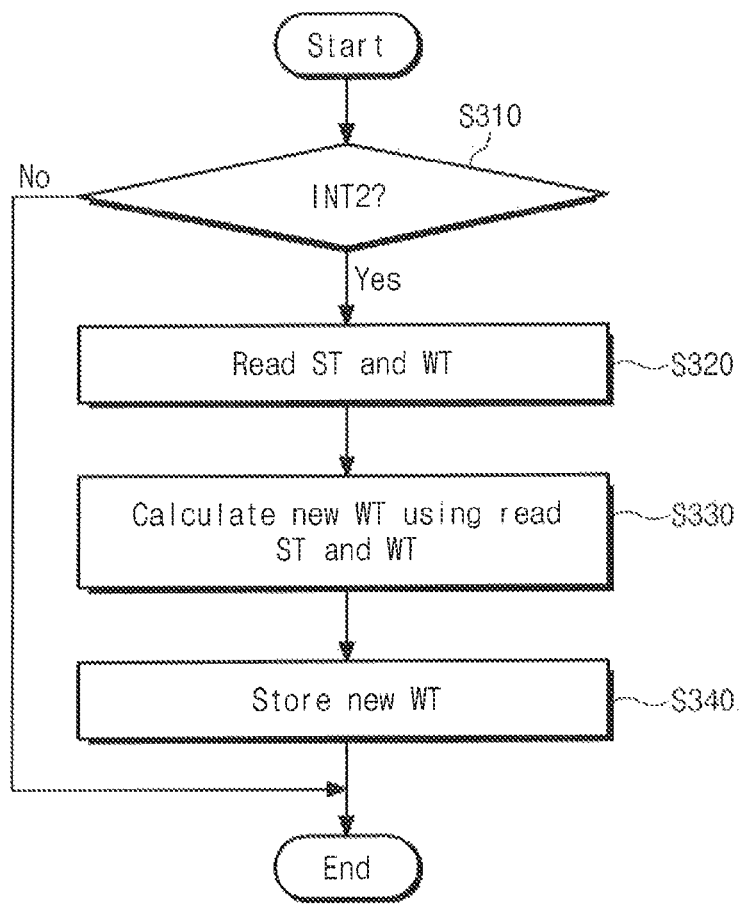
FIG. 9 is a flow chart showing a method of calculating a weighted time according to an exemplary embodiment of the inventive concept.
FIG. 10 shows a table used to calculate a weighted elapse time according to an exemplary embodiment of the inventive concept.

FIG. 9 is a flow chart showing a method of calculating a weighted time WT, according to an exemplary embodiment of the inventive concept. Referring to FIGS. 7 and 9, in step S310, the calculation unit 225 determines whether the second interrupt signal INT2 is activated. When the second interrupt signal INT2 is determined as being not activated, the method ends. If the second interrupt signal INT2 is determined as activated, the operation proceeds to step S320 where the calculation unit 225 reads a sensing temperature ST and a weighted time WT from the RAM 130.

In step S330, the calculation unit 225 calculates a new weighted time WT using an elapse time, the sensing temperature ST and the weighted time WT which were read in step S320. For example, the calculation unit 225 calculates a weighted elapse time WET based on the sensing temperature ST. The weighted elapse time WET may represent a time that is obtained by weighting, based on the sensing temperature ST, an elapse time that elapses up to the present from a time when the weighted time WT read from the RAM 130 is previously calculated. Such elapse time may be detected using the second interrupt signal INT2. For example, the elapse time may be calculated by counting the clock of the second interrupt signal INT2. The calculation unit 225 sums up the weighted time WT read from the RAM 130 and the calculated weighted elapse time WET to obtain the new weighted time WT.

According to an exemplary embodiment, the initial value of the weighted time WT may be zero which is set when programming is performed. The weighted time WT is updated according to the period of the second interrupt signal INT2 until a read operation is performed on the programmed data. In the read operation, the read voltage may be adjusted based on the weighted time WT.

In step S340, the calculation unit 225 stores the new weighted time WT in the RAM 130. For example, the weighted time WT may be stored at a predetermined location of the RAM 130. The weighted time WT previously stored in the RAM 130 may be updated (e.g., overwritten) with the new weighted time WT.

In an exemplary embodiment, the second interrupt signal INT2 may be activated with a period of ten milliseconds. For example, the weighted time WT stored in the RAM 130 may be updated with a period of ten milliseconds. The weighted time of a nonvolatile memory 110 may be updated every ten milliseconds and may be managed in the RAM 130.

In an exemplary embodiment, a weighted elapse time WET may be calculated using a previously stored table PDT. FIG. 10 shows a table PDT1 used to calculate a weighted elapse time WET, according to an exemplary embodiment of the inventive concept. Referring to FIG. 10, the table PDT1 contains information about a weighted elapse time WET according to a sensing temperature ST. For example, the weighted elapse time WET is a first weighted elapse time WET1 when a sensing temperature ST is in a first range R1_ST. The first weighted elapse time WET1 may be an average value (or, a weighted average value) of a weighted elapse time WET when a sensing temperature ST is in the first range R1_ST.

When a sensing temperature ST is in a second range R2_ST having a temperature range higher than the first range R1_ST, the weighted elapse time WET is a second weighted elapse time WET2 longer than the first weighted elapse time WET1. The second weighted elapse time WET2 may be an average value (or, a weighted average value) of a weighted elapse time WET when a sensing temperature ST is in the second range R2_ST. In an exemplary embodiment, the second range R2_ST may include a room temperature.

In case a sensing temperature ST is in a third range R3_ST having a temperature range higher than the second range R2_ST, the weighted elapse time WET is a third weighted elapse time WET3 longer than the second weighted elapse time WET2. The third weighted elapse time WET3 may be an average value (or, a weighted average value) of a weighted elapse time WET when a sensing temperature ST is in the third range R3_ST.

The higher the sensing temperature ST, the longer a weighted elapse time WET selected in the table PDT1. For example, if the sensing temperature ST becomes high, the weighted elapse time WET may be longer than the elapse time measured using the second interrupt signal INT2. If the sensing temperature ST becomes low, the weighted elapse time WET may be shorter than the elapse time measured using the second interrupt signal INT2.

A calculation unit 225 calculates a new weighted elapse time WET by summing up a weighted elapse time selected from the table PDT1 and a weighted time WT read from a RAM 130. For example, the weighted time WT may be longer as a sensing temperature ST increases and may be shorter as a sensing temperature ST decreases.

In exemplary embodiments, the table PDT1 may be stored in a nonvolatile storage medium (e.g., ROM) that a memory controller 120 includes. The calculation unit 225 may calculate a weighted time WT using the table PDT1 stored in the nonvolatile storage medium of the memory controller 120. Alternatively, the table PDT1 may be stored in a nonvolatile memory 110. The table PDT1 stored in the nonvolatile memory 110 may be loaded onto the RAM 130. The calculation unit 225 may calculate a weighted time WT using the table PDT1 loaded on the RAM 130.

Alternatively, a weighted time WT may be calculated by the following equation (1).

$$WTn = WT_0 + F(ST) \quad (1)$$

As understood from the equation (1), a new weighted time WTn may be calculated by summing up a function F1 (ST) and an old weighted time $WT_0$. The function F1 (ST) has a value that is decided according to a sensing temperature ST and is experimentally decided. The value of the function F1 (ST) increases as a sensing temperature ST increases, and the value of the function F1 (ST) decreases as the sensing temperature ST decreases.

The calculation unit 225 calculates the new weighted time WTn according to the equation (1). The calculation unit 225 may be implemented using software, logic circuits or a combination thereof.

In the table PDT1 shown in FIG. 10, for the convenience of description, a sensing temperature ST is divided into first to third ranges R1_ST to R3_ST. However, the inventive concept is not limited thereto. For example, a range of a sensing temperature ST may be divided into more or less ranges.

FIG. 11 shows a table PDT2 used to calculate a weighted elapse time WET, according to an exemplary embodiment of the inventive concept. Referring to FIG. 11, the table PDT2 contains information about a weighted elapse time WET according to a sensing temperature ST and a time interval TI. The time interval TI may represent a time interval when a second interrupt signal INT2 is activated.

For example, the time interval of a second interrupt signal INT2 may be adjusted according to an internal condition or a schedule of a storage device 100 or according to a control of an external device. The weighted time calculation unit 221 may calculate a weighted elapse time WET based on the sensing temperature ST and the time interval TI.

For example, a first weighted elapse time WET1 may be selected from the table PDT2 when a sensing temperature ST is in a first range R1_ST and a time interval TI of the second interrupt signal INT2 is a first time interval TI1. The first weighted elapse time WET1 may be an average value (or, a weighted average value) of a weighted elapse time WET when a sensing temperature ST is in the first range R1_ST and a time interval TI is the first time interval TI1.

A fifth weighted elapse time WET5 longer than the first weighted elapse time WET1 may be selected from the table PDT2 when a sensing temperature ST is in a second range R2_ST having a temperature range higher than the first range R1_ST and a time interval TI is a second time interval TI2. The fifth weighted elapse time WET5 may be an average value (or, a weighted average value) of a weighted elapse time WET when a sensing temperature ST is in the second range R2_ST and a time interval TI is the second time interval TI2.

A ninth weighted elapse time WET9 longer than the fifth weighted elapse time WET5 may be selected from the table PDT2 when a sensing temperature ST is in a third range R3_ST having a temperature range higher than the second range R2_ST and a time interval TI is a third time interval TI3. The ninth weighted elapse time WET9 may be an average value (or, a weighted average value) of a weighted elapse time WET when a sensing temperature ST is in the third range R3_ST and a time interval TI is the third time interval TI3.

In case a sensing temperature ST is in the first range R1_ST and a time interval TI is the second time interval TI2 longer than the first time interval TI1, a fourth weighted elapse time WET4 longer than the first weighted elapse time WET1 may be selected from the table PDT2.

If a sensing temperature ST is in the first range R1_ST and a time interval TI is the second time interval TI2 longer than the first time interval TI1, a fourth weighted elapse time WET4 longer than the first weighted elapse time WET1 may be selected from the table PDT2.

A sixth weighted elapse time WET6 longer than the third and fifth weighted elapse times WET3 and WET5 may be selected from the table PDT2 when a sensing temperature ST is in the third range R3_ST and a time interval TI is the second time interval TI2 longer than the first time interval TI1.

In case a sensing temperature ST is in the first range R1_ST and a time interval TI is the third time interval TI3 longer than the second time interval TI2, a seventh weighted elapse time WET7 longer than the fourth weighted elapse time WET4 may be selected from the table PDT2.

An eighth weighted elapse time WET8 longer than the fifth and seventh weighted elapse times WET5 and WET7 may be selected from the table PDT2 when a sensing temperature ST is in the second range R2_ST and a time interval TI is the third time interval TI3 longer than the second time interval TI2.

If a sensing temperature ST is in the third range R3_ST and a time interval TI is the first time interval TI1, a third weighted elapse time WET3 longer than the second weighted elapse time WET2 may be selected from the table PDT2.

As understood from FIG. 11, as a sensing temperature ST becomes high and a time interval TI become long, a weighted elapse time WET selected from the table PDT2 may become long. As a sensing temperature ST becomes low and a time interval TI become short, a weighted elapse time WET selected from the table PDT2 may become short.

Alternatively, a weighted time WT may be calculated by the following equation (2).

$$WTn = WT_0 + F2(ST, TI) \quad (2)$$

As understood from the equation (2), a new weighted time WTn may be calculated by summing up a function F2 (ST, TI) and an old weighted time $WT_0$. The function F2 ST, TI) has a value that is decided according to a sensing temperature ST and a time interval TI and is experimentally decided. The value of the function F2 (ST, TI) increases as a sensing temperature ST increases, and the value of the function F2 (ST, TI) decreases as the sensing temperature ST decreases.

In the table PDT2 shown in FIG. 11, for the convenience of description, a time interval TI is one of first to third time intervals TI1 to TI3. However, the inventive concept is not limited thereto. For example, a time interval TI may have more or less values.

FIG. 12 shows a table PDT3 used to calculate a weighted elapse time WET, according to an exemplary embodiment of the inventive concept. Referring to FIG. 12, a table PDT3 contains information about a weighted elapse time WET according to a sensing temperature ST and the number of program-erase cycles PE. The number of program-erase cycles PE may represent the number of erase operations performed in the nonvolatile memory 110. Memory cells MC of the nonvolatile memory 110 may deteriorate when the number of program-erase cycles increases, thereby resulting in an increase in the amount of charge leaked from memory cells MC. A weighted time calculation unit 221 may calculate a weighted time WT based on a sensing temperature ST and the number of program-erase cycles PE of the nonvolatile memory 110.

For example, a first weighted elapse time WET1 may be selected from a table PDT3 when a sensing temperature ST is in a first range R1_ST and the number of program-erase cycles PE is in a first range R1_PE. The first weighted elapse time WET1 may be an average value (or, a weighted average value) of a weighted elapse time WET when a sensing temperature ST is in the first range R1_ST and the number of program-erase cycles PE is in the first range R1_PE.

In case a sensing temperature ST is in a second range R2_ST having a temperature range higher than the first range R1_ST and the number of program-erase cycles PE is in the first range R1_PE, a second weighted elapse time WET2 longer than the first weighted elapse time WET1 may be selected from the table PDT3.

If a sensing temperature ST is in a third range R3_ST having a temperature range higher than the second range R2_ST and the number of program-erase cycles PE is in the first range R1_PE, a third weighted elapse time WET3 longer than the second weighted elapse time WET2 may be selected from the table PDT3.

A fourth weighted elapse time WET4 longer than the first weighted elapse time WET1 may be selected from the table PDT3 when a sensing temperature ST is in the first range R1_ST and the number of program-erase cycles PE is in the second range R2_PE greater than the first range R1_PE.

A fifth weighted elapse time WET5 longer than the second and fourth weighted elapse times WET2 and WET4 may be selected from the table PDT3 when a sensing temperature ST is in the second range R2_ST and the number of program-erase cycles PE is in a second range R2_PE greater than the first range R1_PE.

In a case where a sensing temperature ST is in the third range R3_ST and the number of program-erase cycles PE is in the second range R2_PE, a sixth weighted elapse time WET6 longer than the third and fifth weighted elapse times WET3 and WET5 may be selected from the table PDT3.

When a sensing temperature ST is in the first range R1_ST and the number of program-erase cycles PE is in a third second range R3_PE greater than the second range R2_PE, a seventh weighted elapse time WET7 longer than the fourth weighted elapse time WET4 may be selected from the table PDT3.

An eighth weighted elapse time WET8 longer than the fifth and seventh weighted elapse times WET5 and WET7 may be selected from the table PDT3 if a sensing temperature ST is in the second range R2_ST and the number of program-erase cycles PE is in the third range R3_PE greater than the second range R2_PE.

In a case where a sensing temperature ST is in the third range R3_ST and the number of program-erase cycles PE is in the third range R3_PE greater than the second range R2_PE, a ninth weighted elapse time WET9 longer than the sixth and eighth weighted elapse times WET6 and WET8 may be selected from the table PDT3.

As understood from FIG. 12, as a sensing temperature ST becomes high and the number of program-erase cycles PE increases, a weighted elapse time WET selected from the table PDT3 may become long. As a sensing temperature ST becomes low and the number of program-cycles PE decreases, a weighted elapse time WET selected from the table PDT3 may become short.

Alternatively, a weighted time WT may be calculated by the following equation (3).

$$WTn = WT_0 + F3(ST,PE) \quad (3)$$

As understood from the equation (3), a new weighted time WTn may be calculated by summing up a function F3 (ST, PE) and an old weighted time $WT_0$. The function F3 (ST, PE) has a value that is decided according to a sensing temperature ST and the number of program-erase cycles PE and is experimentally decided. The function F3 (ST, PE) has a value which increases as a sensing temperature ST increases and which decreases as it decreases.

In the table PDT3 shown in FIG. 12, for the convenience of description, the number of program-erase cycles PE is divided into first to third ranges R1_PE to R3_PE. However, the inventive concept is not limited thereto. For example, the number of program-erase cycles PE may be divided into more or less ranges.

Figure 13:
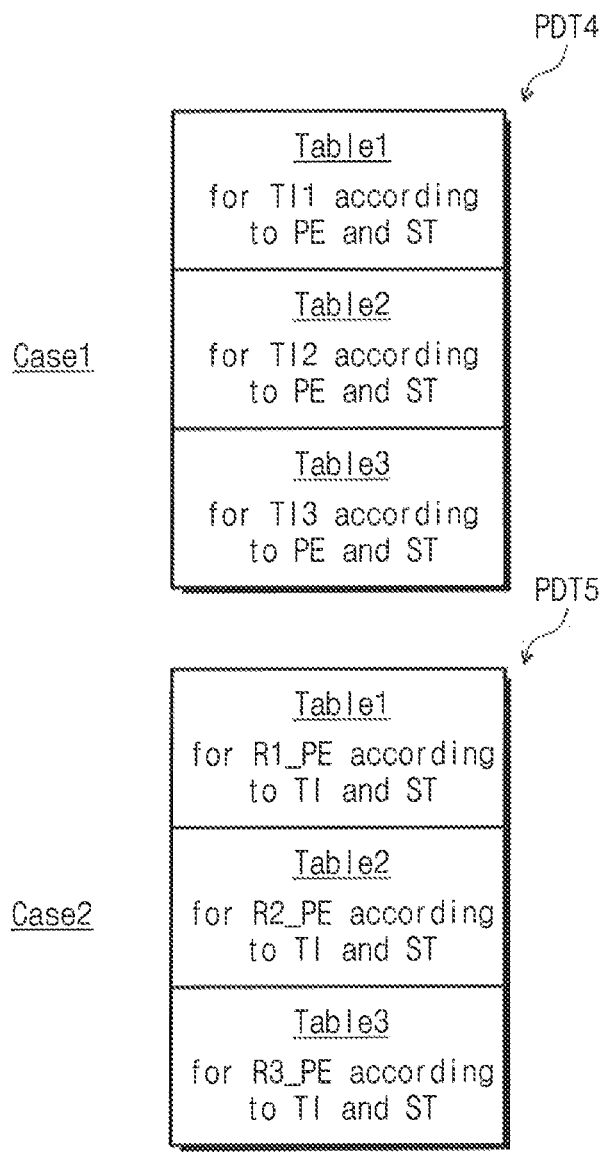
FIG. 13 shows tables used to calculate a weighted elapse time according to an exemplary embodiment of the inventive concept.

FIG. 13 shows tables PDT4 and PDT5 used to calculate a weighted elapse time WET, according to an exemplary embodiment of the inventive concept. The tables PDT4 and PDT5 of FIG. 13 may include a weighted elapse time WET according to a combination of a sensing temperature ST, a time interval TI, and the number of program-erase cycles PE.

The fourth table PDT4 may include first to third sub-tables Table 1 to Table 3. The first sub-table Table 1 may include information based on a sensing temperature ST and the number of program-erase cycles PE for a first time interval TI1 of the second interrupt signal INT2. The second sub-table may include information based on a sensing temperature ST and the number of program-erase cycles PE for a second time interval TI2 of the second interrupt signal INT2. The third sub-table may include information based on a sensing temperature ST and the number of program-erase cycles PE for a third time interval TI3 of the second interrupt signal INT2. In exemplary embodiments, each of the first to third sub-tables may be configured to be similar to a table PDT3 shown in FIG. 12.

The fifth table PDT5 may include first to third sub-tables Table 1 to Table 3. The first sub-table Table 1 may include information based on a sensing temperature ST and a time interval TI for a first range R1_PE of the number of program-erase cycles PE. The second sub-table Table 2 may include information based on a sensing temperature ST and a time interval TI for a second range R2_PE of the number of program-erase cycles PE. The third sub-table may include information based on a sensing temperature ST and a time interval TI for a third range R3_PE of the number of program-erase cycles PE. In exemplary embodiments, each of the first to third sub-tables Table 1 to Table 3 may be configured to be similar to a table PDT2 shown in FIG. 11.

Figure 14:
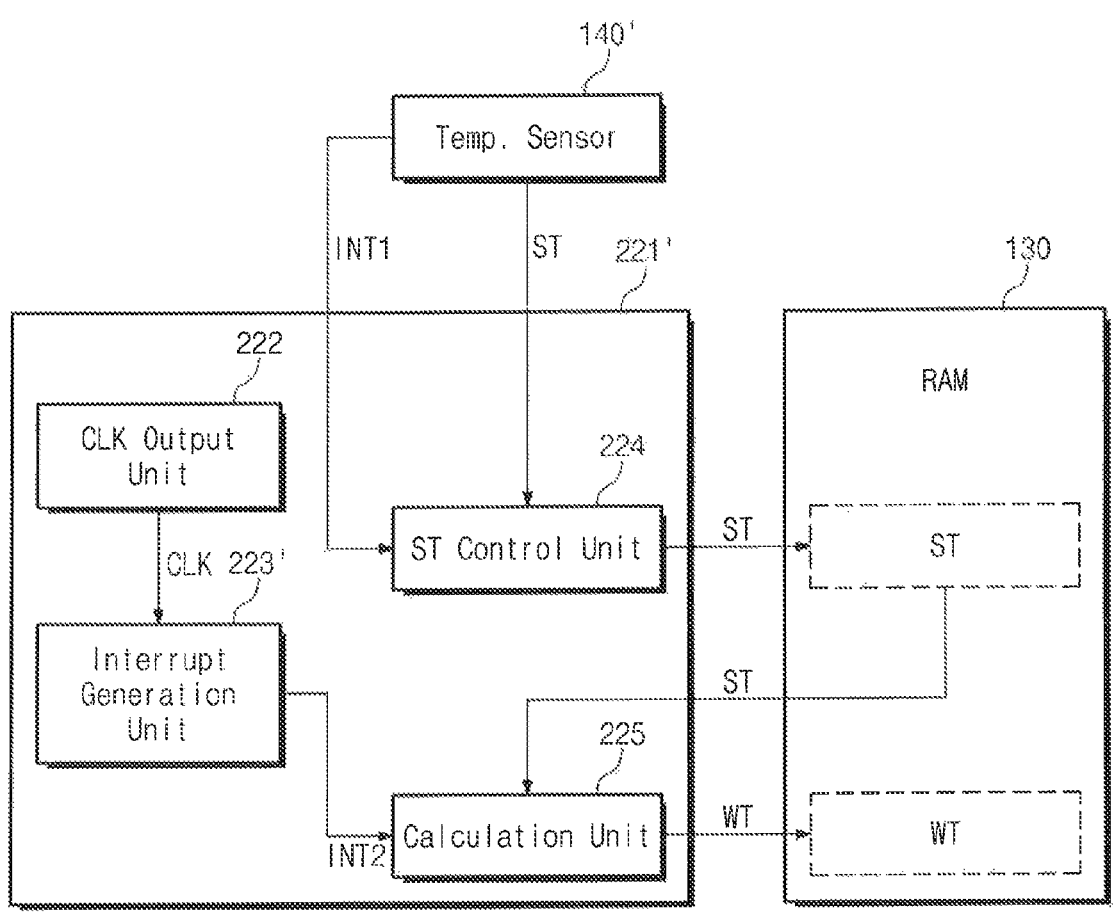
FIG. 14 is a block diagram illustrating a weighted time calculation according to an exemplary embodiment of the inventive concept.

FIG. 14 is a block diagram illustrating a weighted time calculation unit 221', a RAM 130 and a temperature sensor 140', according to an exemplary embodiment of the inventive concept. As illustrated in FIG. 14, the weighted time calculation unit 221' contains a clock signal output unit 222, an interrupt generation unit 223', a sensing-temperature control unit 224, and a calculation unit 225.

The clock signal output unit 222 outputs a clock signal CLK.

The interrupt generation unit 223 receives the clock signal CLK from the clock signal output unit 222, and outputs a second interrupt signal INT2 in response to the clock signal CLK.

The sensing-temperature control unit 224 reads a sensing temperature ST from the temperature sensor 140 in response to the first interrupt signal INT1. The sensing-temperature control unit 224 stores the sensing temperature ST from the temperature sensor 140 in the RAM 130.

The calculation unit 225 reads the sensing temperature ST and the weighted time WT from the RAM 130 in response to the second interrupt signal INT2. Based on the sensing temperature ST and the weighted time WT, the calculation unit 225 updates the weighted time WT that is stored in the RAM 130.

As compared to a weighted time calculation unit 221 shown in FIG. 7, the interrupt generation unit 223' of the weighted time calculation unit 221' does not output the first interrupt signal INT1. The first interrupt signal INT1 may be output from the temperature sensor 140'. The temperature sensor 140' outputs the first interrupt signal INT1 if a sensing temperature ST varies by a predetermined value. For example, the temperature sensor 140' may output the first interrupt signal INT1 if a sensing temperature ST varies by 1° C. The sensing-temperature control unit 224 may be activated in response to the first interrupt signal INT1 which is generated from the temperature sensor 140' when the sensing temperature ST changes by 1° C.

Accordingly, the weighted time calculation unit 221 shown in FIG. 7 monitors a sensing temperature ST periodically, but the weighted time calculation unit 221 monitors a sensing temperature ST according to the change in the sensing temperature ST.

Figures 15, 16:
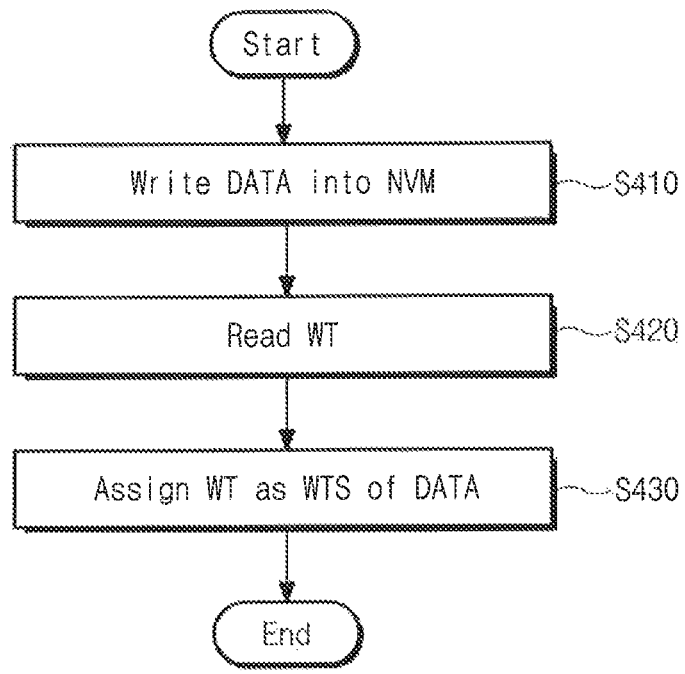
FIG. 15 is a flow chart showing a method of writing data at a nonvolatile memory according to an exemplary embodiment of the inventive concept.
FIG. 16 is a table showing weighted time stamps registered at a first time stamp table according to an exemplary embodiment of the inventive concept.

FIG. 15 is a flow chart showing a method of writing data to a nonvolatile memory according to an exemplary embodiment of the inventive concept. Referring to FIGS. 1 and 15, in step S410, the memory controller 120 writes data to the nonvolatile memory 110. For example, the memory controller 120 writes data to the nonvolatile memory 110 according to a write request received from an external host device.

In step S420, the memory controller 120 reads a weighted time WT stored in the RAM 130.

In step S430, the memory controller 120 registers a weighted time as a weighted time stamp WTS of written data. The weighted time stamp WTS may indicates, as a weighted time WT, a time when data is written to the nonvolatile memory 110. The weighted time stamp WTS may be registered in the first time stamp table TST1 of the RAM 130. For example, the weighted time stamp WTS may include an address of data and the weighted time WT.

In the memory controller 120, the RAM 130 buffers data to be written to the nonvolatile memory 110. For example, the memory controller 120 stores data, transferred together with a write request from an external host device, in the RAM 130, without writing it to the nonvolatile memory 110. For example, data corresponding to a plurality of write requests may be stored in the RAM 130. The memory controller 120 writes data buffered by the RAM 130 to the nonvolatile memory 110 according to a predetermined schedule and a request of the external host device or if a predetermined condition is satisfied.

If the size of data buffered by the RAM 130 is greater than that of a write unit of the nonvolatile memory 110, the memory controller 120 divides the buffered data into a plurality of segment data with the size corresponding to the write unit and provides the plurality of segment data to the nonvolatile memory 110 together with the plurality of write requests.

For example, the buffered data may be written to the nonvolatile memory 110 at the same time regardless of a write request from the external host device and the write unit of the nonvolatile memory 110. The same weighted time WT may be registered as a weighted time stamp WTS of data that is written to the nonvolatile memory 110 at the same time.

For example, data that is buffered in the RAM 130 and is then written to the nonvolatile memory 110 may be different in size from a write request unit of the external host device and/or a write unit of the nonvolatile memory 110.

FIG. 16 is a table showing weighted time stamps WTS registered at the first time stamp table TST1, according to an exemplary embodiment of the inventive concept. Referring to FIGS. 1 and 16, when a write operation is performed on memory cells of a first address ADDR1, a first weighted time WT1 indicating a time when the write operation is performed may be registered as a weighted time stamp WTS of the first address ADDR1. For example, the first address ADDR1 may include a range of addresses at which a write operation is performed or their values. The range of the first address ADDR1 may be identical with or different from a write unit of the nonvolatile memory 110.

For the convenience of description, it is assumed that a write operation is performed on memory cells of a second address ADDR2 after the write operation of the first address ADDR1 is performed. When a write operation about the second address ADDR2 is performed, a second weighted time WT2 indicating a time when the write operation is performed may be registered as a weighted time stamp WTS of the second address ADDR2. For example, the second address ADDR2 may include a range of addresses at which a write operation is performed or their values. The range of the second address ADDR2 may be identical with a range of the first address ADDR1, or a range of the second address ADDR2 may be different from a range of the first address ADDR1. The range of the second address ADDR2 may be identical with or different from a write unit of the nonvolatile memory 110. The second weighted time WT2 may be calculated later than the first weighted time WT1.

It is assumed that a write operation is performed on memory cells of a third address ADDR3 after the write operation of the second address ADDR2 is performed. When the write operation is performed on the memory cells of the third address ADDR3, a third weighted time WT3 indicating a time when the write operation is performed may be registered as a weighted time stamp WTS of the third address ADDR3. For example, the third address ADDR3 may include a range of addresses at which a write operation is performed or their values. The range of the third address ADDR3 may be identical with the range of the first address ADDR1 or the second address ADDR2, or the range of the third address ADDR3 may be different from the range of the first address ADDR1 or the second address ADDR2. The range of the third address ADDR3 may be identical with or different from a write unit of the nonvolatile memory 110. The third weighted time WT3 may be calculated later than the second weighted time WT2.

Figure 17:
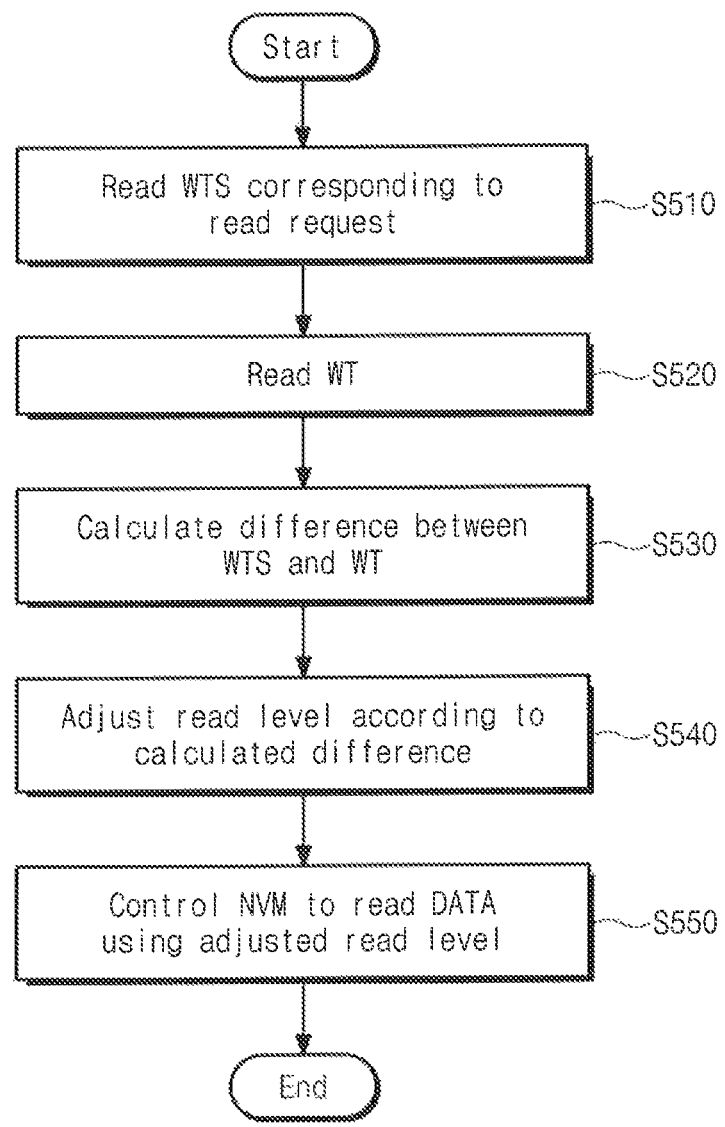
FIG. 17 is a flow chart showing a method of reading data from a nonvolatile memory 110 according to an exemplary embodiment of the inventive concept.

FIG. 17 is a flow chart showing a method of reading data from a nonvolatile memory according to an exemplary embodiment of the inventive concept. Referring to FIGS. 1, 16, and 17, in step S510, the memory controller 120 reads a weighted time stamp WTS corresponding to a read request. For example, the memory controller 120 may issue a read request internally or receive a read request from an external host device. The memory controller 120 may read a weighted time stamp WTS corresponding to data read according to the read request from the first time stamp table TST1 stored in the RAM 130. The memory controller 120 may compare the address of the read request with addresses registered in the first time stamp table TST1. The memory controller 120 may read a weighted time stamp WST corresponding to the address of the read request from the first time stamp table TST1.

In step S520, the memory controller 120 reads the weighted time WT from the RAM 130. For example, the memory controller 120 may read the weighted time WT from the RAM 130 as the current time.

In step S530, the memory controller 120 calculates a difference between the weighted time stamp WTS and the weighted time WT. For example, the memory controller 120 may calculate a difference between a first weighted time WT1 corresponding to the current time and a second weighted time WT2 of the weighted time stamp WST. The difference indicates a time difference between the current time of WT1 and the time of WT2 when data to be read was written. The time difference may be represented as a weighted time. For example, the difference may relates to the amount of charges leaked from memory cells MC in the light of a temperature variation, after data to be read is written to the memory cells MC of the nonvolatile memory 110. The amount of charges leaked from memory cells MC for the same elapse time between a program operation and a read operation may be different according to a device temperature, as shown in FIG. 4. Accordingly, the shift in threshold voltages of memory cells MC may vary according to device temperatures for the same elapse time. In an exemplary embodiment, read voltage levels may be adjusted based on the difference to read data represented by shifted threshold voltages according to the time elapse.

In step S540, the memory controller 120 adjusts a read voltage level according to the difference thus calculated. For example, the memory controller 120 may adjust read voltage levels based on a difference between the weighted time stamp WTS and the weighted time WT. In this case, threshold voltage shift of memory cells due to charge leak of the memory cells may be considered. The amount of such charge leak of memory cells may depend on the lapse of time and/or a temperature variation, and thus the memory controller 120 may adjust read voltage levels in the light of the lapse of time and a temperature variation.

In step S550, the memory controller 120 controls the nonvolatile memory 110 such that data is read using the adjusted read voltage level. For example, the memory controller 120 may issue a command for adjusting read voltage levels to the nonvolatile memory 110. Alternatively, the memory controller 120 may provide the nonvolatile memory 110 with a control signal(s) for adjusting read voltage levels. The memory controller may issue a command to the nonvolatile memory 110 such that a read operation is performed using the adjusted read voltage levels. The memory controller 120 may transfer information of the adjusted read voltage levels to the nonvolatile memory 110 together with a read command.

As described above, the storage device 100 according to an exemplary embodiment of the inventive concept may be configured to manage a weighted time WT that is based on a leakage amount of charge from a memory cell according to the lapse of time and a temperature variation between when a program operation is performed on the memory cell and when a read operation is performed on the memory cell after the program operation. The storage device 100 generates a weighted time stamp WTS using a weighted time WT when writing or programming data to the nonvolatile memory 110. Reading data from the nonvolatile memory 110, the storage device 100 calculates a difference between the weighted time WT and the weighted time stamp WTS and adjusts read voltage levels using the difference thus calculated. Data is read from the nonvolatile memory 110 using the adjusted read voltage levels. Thus, read voltages may be adjusted based on the lapse of time and a temperature variation to increase reliability of the storage device 100.

Figure 18:
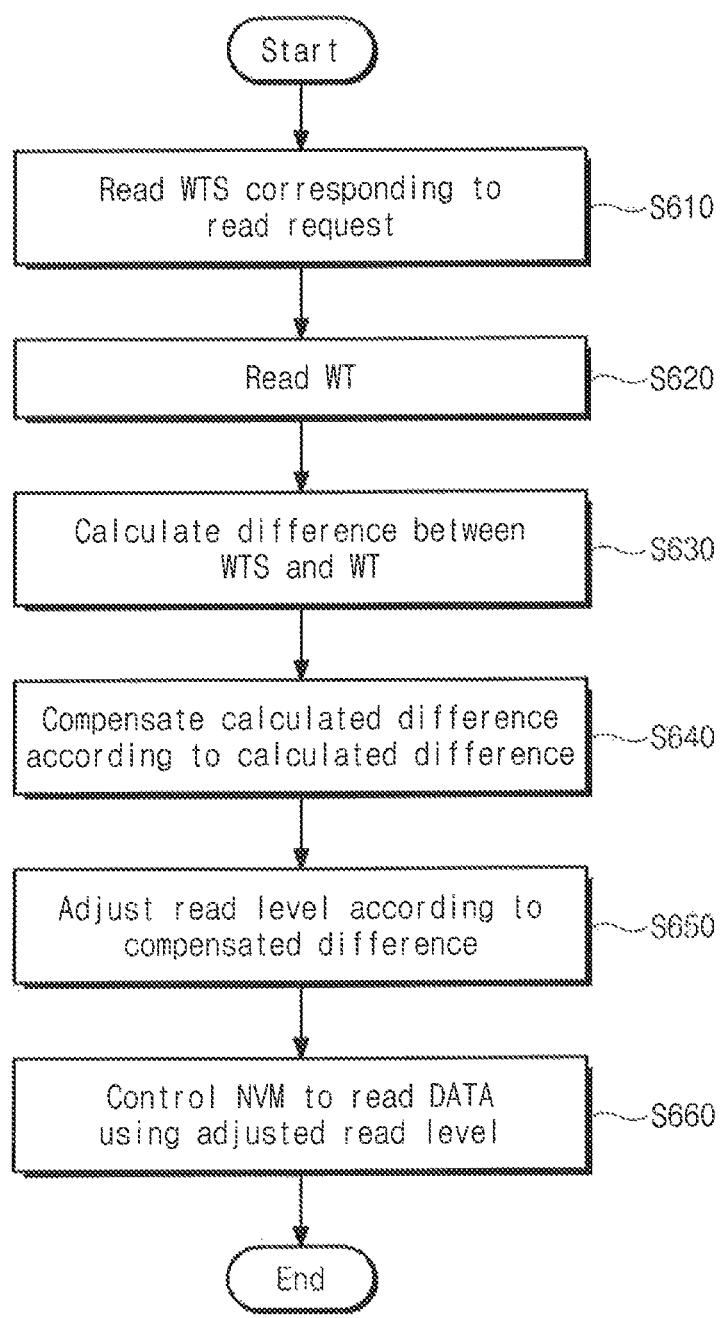
FIG. 18 is a flow chart showing a method of reading data from a nonvolatile memory 110 according to an exemplary embodiment of the inventive concept.

FIG. 18 is a flow chart showing a method of reading data from a nonvolatile memory according to an exemplary embodiment of the inventive concept. Referring to FIGS. 1, 16, and 18, in step S610, the memory controller 120 reads a weighted time stamp WTS corresponding to a read request. In step S620, the memory controller 120 reads a weighted time WT from the RAM 130. In step S630, the memory controller 120 calculates a difference between the weighted time stamp WTS and the weighted time WT. Steps S610 to S630 may be performed substantially the same as steps S510 to S530 shown in FIG. 17.

In step S640, the memory controller 120 compensates difference in the amount of charges leaked in unit time. For example, as illustrated in FIG. 4, a leakage amount per unit time changes as an elapse time T increases. In step S640, the memory controller 120 may compensate such difference calculated in step S630 considering such change in the leakage amount per unit time. For example, a first leakage amount until an initial time IT elapses after data is written to memory cells MC may be different from a second leakage amount after the initial time IT elapses. For example, the first leakage amount may be greater than the second leakage amount.

If the calculated difference indicates a time shorter than the initial time IT, a time that elapses after data is written to memory cells MC may be shorter than the initial time IT. In this case, the memory controller 120 may make up for the difference based on the first leakage amount. For example, the memory controller 120 may increase the difference. Such compensation will be described later with reference to FIG. 19.

When the calculated difference indicates a time longer than the initial time IT, a time that elapses after data is written to memory cells MC may be longer than the initial time IT. In this case, the memory controller 120 may make up for the difference based on both the first leakage amount and the second leakage amount. For example, the memory controller 120 may keep or increase the calculated difference. Such compensation will be described later with reference to FIG. 19.

In step S650, the memory controller 120 adjusts a read voltage level according to the compensated difference. In step S660, the memory controller 120 controls the nonvolatile memory 110 such that data is read using the adjusted read voltage level. Steps S650 and S660 may be performed to be similar to steps S550 and S560 shown in FIG. 17.

FIG. 19 is a table PDT6 showing a method of compensating for a difference calculated by a memory controller according to an exemplary embodiment of the inventive concept. When a calculated difference is in a first range R1_DIF, the memory controller 120 selects a first compensation coefficient CC1. The memory controller 120 obtains a compensated difference by multiplying the first compensation coefficient CC1 to the calculated difference.

When a calculated difference is in a second range R2_DIF having a value greater than the first range R1_DIF and less than a third range R3_DIF, the memory controller 120 selects a second compensation coefficient CC2. The memory controller 120 obtains a compensated difference by multiplying the second compensation coefficient CC2 to the calculated difference.

When a calculated difference is in the third range R3_DIF having a value greater than the second range R2_DIF, the memory controller 120 selects a third compensation coefficient CC3. The memory controller 120 obtains a compensated difference by multiplying the third compensation coefficient CC3 to the calculated difference.

In an exemplary embodiment, the table PDT6 may be stored in a nonvolatile storage medium (e.g., ROM) that the memory controller 120 includes. The memory controller 120 may calculate a compensated difference using the table PDT6 stored in the nonvolatile storage medium. The table PDT6 may be stored in the nonvolatile memory 110. The table PDT6 stored in the nonvolatile memory 110 may be loaded onto the RAM 130. The memory controller 120 may calculate the compensated difference using the table PDT6 stored in the RAM 130.

Alternatively, the compensated difference may be calculated according to the following equation (4).

$$DIF2 = F4(DIF1) \tag{4}$$

With the equation (4), a compensated difference DIF2 may be calculated according to a function F4(DIF1). The function F4(DIF1) has a value that is decided according to a calculated difference DIF1 and is experimentally decided.

The calculation of the equation (4) may be implemented using software, logic circuits or a combination thereof.

For the convenience of description, in the table PDT6 shown in FIG. 19, a calculated difference is divided into first to third ranges R1_DIF to R3_DIF. However, the inventive concept is not limited thereto. For example, a calculated difference may be divided into more or less ranges.

As described above, the amount of charge leaked from memory cells per unit time may vary with time after data is written to the memory cells MC. A storage device 100 according to an exemplary embodiment of the inventive concept may adjust a read voltage level based on the characteristic that the amount of charge leaked per unit time varies to increase reliability of the storage device 100.

Figure 20:
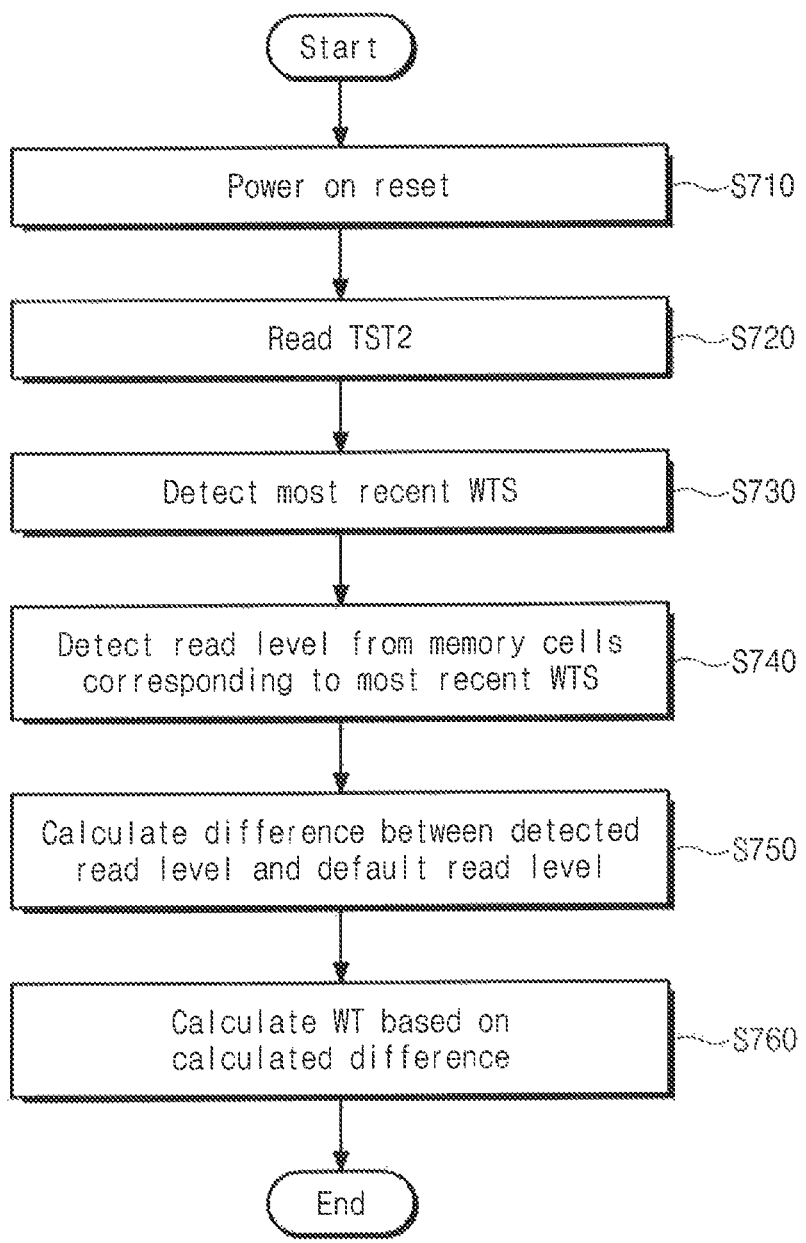
FIG. 20 is a flow chart showing a method of restoring a weighted time in a storage device when a power is supplied to the storage device 100 after powered off.

FIG. 20 is a flow chart showing a method of calculating a weighted time WT in a storage device 100 when power is off. Referring to FIGS. 1 and 20, in step S710, a power-on reset operation of the storage device 100 is performed.

In step S720, the memory controller 120 reads a second time stamp table TST2 stored in the nonvolatile memory 110. The second time stamp table TST2 may be stored in the RAM 130 as a first time stamp table TST1.

In step S730, the memory controller detects the most recently registered one of weighted time stamps WTS from the first time stamp table TST1. For example, in case the first time stamp table TST1 is configured as illustrated in FIG. 16, the weighted time stamp WTS of third data DATA3 may be detected as the most recently registered weighted time stamp WTS. In this case, after the weighted time stamp WTS of third data DATA3 is registered in the first time stamp table, power supplied to the 100 is off and then power is supplied. While power is off, charges from the memory cells MC is leaked, but the weighted time calculation unit 221 does not work.

In step S740, the memory controller 120 detects a read voltage level from memory cells corresponding to the most recently registered weighted time stamp WTS. For example, the memory controller 120 may detect optimal read voltage levels described with reference to FIG. 5 from memory cells MC corresponding to the most recently registered weighted time stamp WTS.

In step S750, the memory controller 120 calculates a difference between the detected read voltage level and a default read voltage level.

In step S760, the memory controller 120 calculates a weighted time WT based on the difference of the read voltage levels thus calculated. The weighted time WT may be stored in the RAM 130. The weighted time WT may represent the current weighted time including time of power being off.

Figure 21:
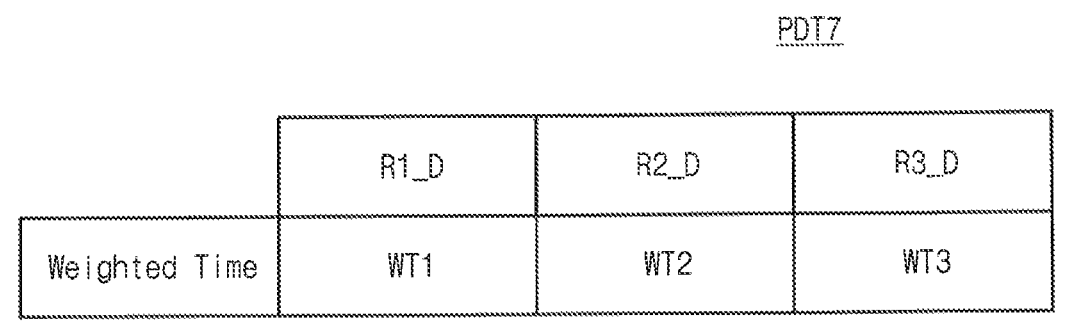

FIG. 21 is a table PDT7 showing an exemplary embodiment in which the memory controller 120 calculates a weighted time WT according to a read voltage level difference. Referring to FIG. 21, when a calculated difference is in a first range R1_D, a memory controller 120 selects a first weighted time WT1.

If a calculated difference is in a second range R2_D having a value greater than the first range R1_D and less than a third range R3_D, the memory controller 120 selects a second weighted time WT2.

In case a calculated difference is in the third range R3_D having a value greater than the second range R2_D, the memory controller 120 selects a third weighted time WT3.

In an exemplary embodiment, the table PDT7 may be stored in a nonvolatile storage medium (e.g., ROM) that the memory controller 120 includes. The memory controller 120 may calculate a compensated difference using the table PDT7 stored in the nonvolatile storage medium. The table PDT7 may be stored in the nonvolatile memory 110. The table PDT7 stored in the nonvolatile memory 110 may be loaded onto the RAM 130. The memory controller 120 may calculate the compensated difference using the table PDT7 stored in the RAM 130.

Alternatively, the compensated difference may be calculated according to the following equation (5).

$$WT2 = WT1 + F5(D) \tag{5}$$

A weighted time WT2 may be calculated by summing up a function F5(D) and a weighted time WT1 of a weighted time stamp WST. The function F5(D) has a value that is decided according to a calculated difference D and is experimentally decided. The function F5(D) has an increasing value as the calculated difference D increases and has a decreasing value as it decreases.

The calculation of equation (5) may be implemented using software, logic circuits or a combination thereof.

For the convenience of description, in the table PDT7 shown in FIG. 21, the calculated difference D is divided into first to third ranges R1_D to R3_D. However, the inventive concept is not limited thereto. For example, a calculated difference D may be divided into more or less ranges.

As described above, charge may be continuously leaked from memory cells MC of the nonvolatile memory 110 while power is not supplied thereto. For example, a weighted time WT need to be calculated to include an elapsed time during which power is off. The storage device 100 according to an exemplary embodiment of the inventive concept may calculate the amount of charge leaked, based on a difference between an optimal read voltage level and a default read voltage level of the most recently registered weighted time stamp WTS. Based on the leakage amount thus calculated, the storage device 100 calculates the current weighted time WT when power is supplied to the nonvolatile memory 110. Thus, a read and a write operation may be performed considering the amount of charge leaked while power is not supplied to the nonvolatile memory 110 to increase reliability of the storage device 100.

Figure 22:
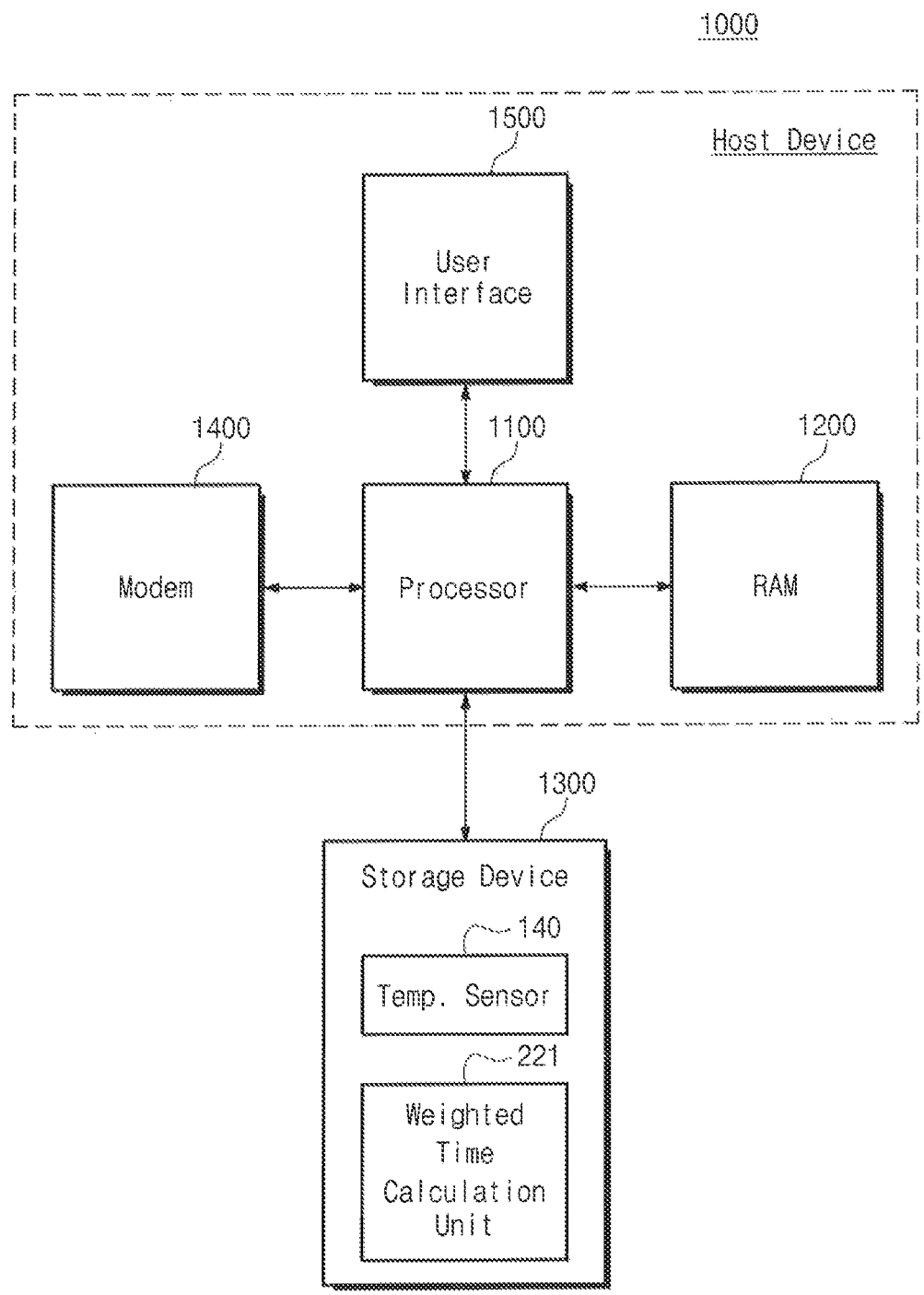
FIG. 22 is a block diagram illustrating a computing device according to an exemplary embodiment of the inventive concept.

FIG. 22 is a block diagram illustrating a computing device 1000 according to an exemplary embodiment of the inventive concept. Referring to FIG. 22, a computing device 1000 includes a processor 1100, a RAM 1200, a storage device 1300, a modem 1400, and a user interface 1500.

The processor 1100 controls an operation of the computing device 1000 and performs a logical operation. The processor 1100 is formed of a system-on-chip (SoC). The processor 1100 may be a general purpose processor, a specific-purpose processor, or an application processor.

The RAM 1200 communicates with the processor 1100. The RAM 1200 may be a working memory of the processor 1100 or the computing device 1000. The processor 1100 stores codes or data in the RAM 1200 temporarily. The processor 1100 executes codes stored in the RAM 1200 and processes data. The processor 1100 executes a variety of software, such as, but is not limited to, an operating system and an application, stored in the RAM 1200. The processor 1100 controls an operation of the computing device 1000 using the RAM 1200. The RAM 1200 may include a volatile memory such as, but is not limited to, a static RAM (SRAM), a dynamic RAM (DRAM), a synchronous DRAM, and so on or a nonvolatile memory such as, but is not limited to, a Phase-change RAM (PRAM), a Magnetic RAM (MRAM), a Resistive RAM (RRAM), a Ferroelectric RAM (FRAM), and so on.

The storage device 1300 communicates with the processor 1100. The storage device 1300 is used to store data. The storage device 1300 stores a boot image for driving the computing device 1000. The storage device 1300 stores source codes of a variety of software, such as an operating system and an application. The storage device 1300 stores data that is processed by a variety of software, such as an operating system and an application.

In an exemplary embodiment, the processor 1100 drives a variety of software, such as an operating system and an application, by loading source codes stored in the storage device 1300 onto the RAM 1200 and executing codes loaded onto the RAM 1200. The processor 1100 loads data stored in the storage device 1300 onto the RAM 1300 and processes data loaded onto the RAM 1200. The processor 1100 stores data of data stored in the RAM 1200 in the storage device 1300.

The storage device 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 1400 communicates with an external device according to a control of the processor 1100. For example, the modem 1400 communicates with the external device in a wire or wireless manner. The modem 1400 may communicate with the external device, based on at least one of communication protocols such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 1500 communicates with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as a Liquid Crystal Display (LCD), an OLED (Organic Light Emitting Diode) display device, an AMOLED (Active Matrix OLED) display device, a speaker, a motor, and so on.

The storage device 1300 contains a storage device 100 according to an exemplary embodiment of the inventive concept. The storage device 1300 includes a temperature sensor 140 and a weighted time calculation unit 221. The storage device 1300 calculates a weighted time WT based on the lapse of time and a temperature variation and performs a read and a write operation using the weighted time WT.

The processor 1100, RAM 1200, modem 1400, and user interface 1500 may constitute an external host device of the storage device 1300.

Figure 23:
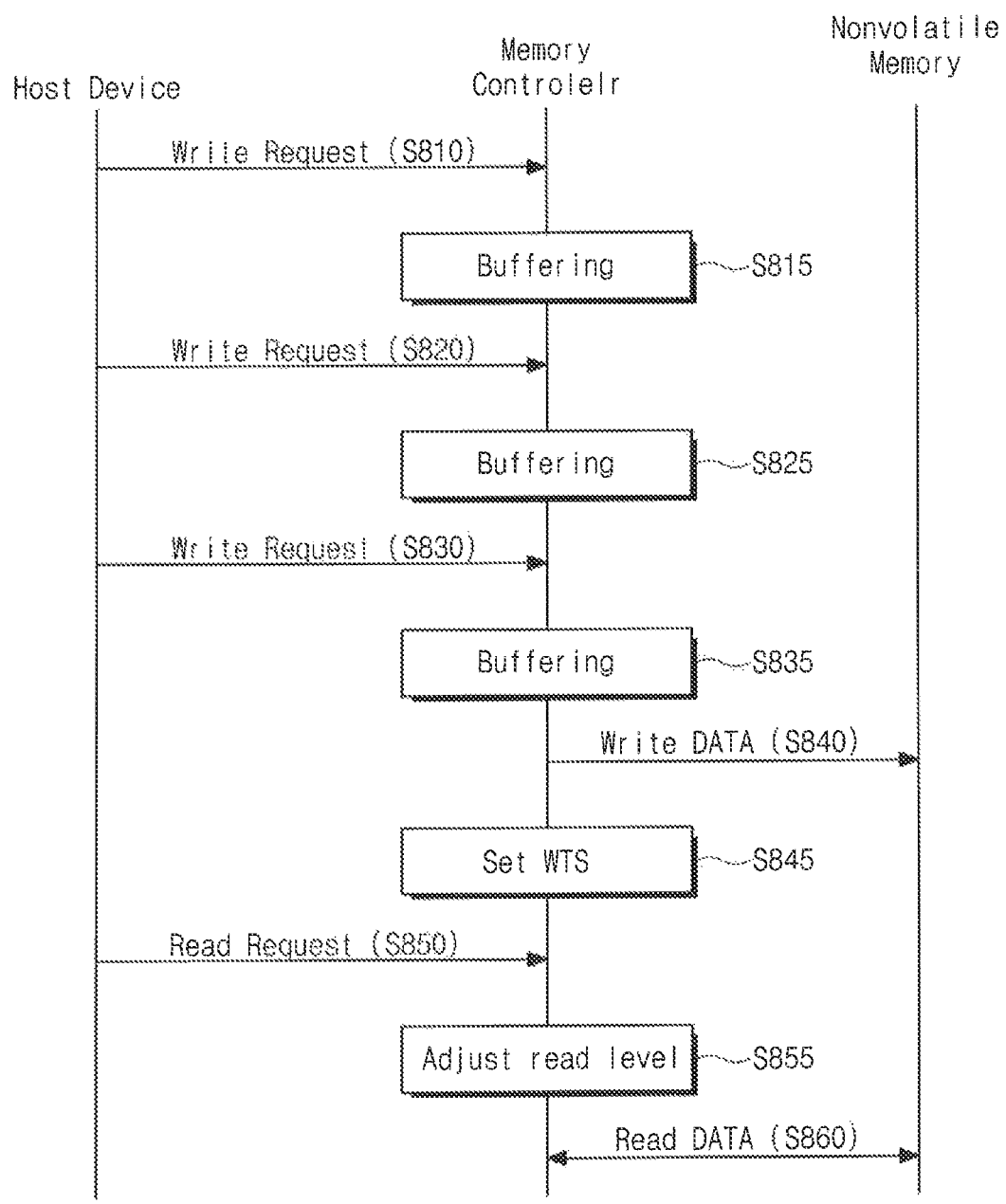
FIG. 23 is a flow chart illustrating an operating method of a computing device 1000 according to an exemplary embodiment of the inventive concept.

FIG. 23 is a flow chart illustrating an operating method of a computing device 1000 according to an exemplary embodiment of the inventive concept. Referring to FIGS. 1, 22, and 23, in step S810, a host device issues a first write request to the memory controller 120. In step S815, the memory controller 120 may buffer data received with the first write request in the RAM 130.

In step S820, the host device issues a second write request to the memory controller 120. In step S825, the memory controller 120 may buffer data received with the second write request in the RAM 130.

In step S830, the host device issues a third write request to the memory controller 120. In step S835, the memory controller 120 may buffer data received with the third write request in the RAM 130.

In step S840, the memory controller 120 writes data buffered in the RAM 130 to the nonvolatile memory 110. For example, the memory controller 120 may write data, buffered in steps S815, S825, and S835, to the nonvolatile memory 110.

In step S845, the memory controller 120 determines a weighted time stamp WTS of data written in step S840, based on the weighted time WT stored in the RAM 130.

In step S850, the host device issues a read request to the memory controller 120 for a part or all of data written to the nonvolatile memory 110 in step S840.

In step S855, the memory controller 120 adjusts a read voltage level. For example, the memory controller 120 calculates a difference between the weighted time stamp WTS and the weighted time WT and adjusts a read voltage level according to the calculated difference.

In step S860, the memory controller 120 reads data from the nonvolatile memory using the adjusted read voltage level.

As described with reference to FIG. 23, the host device may issue a write request and a read request to the memory controller 120. The memory controller 120 manages the weighted time WT and the weighted time stamp WTS without external intervention and adjusts a read voltage level based on the weighted time WT and the weighted time stamp WTS.

Figure 24:
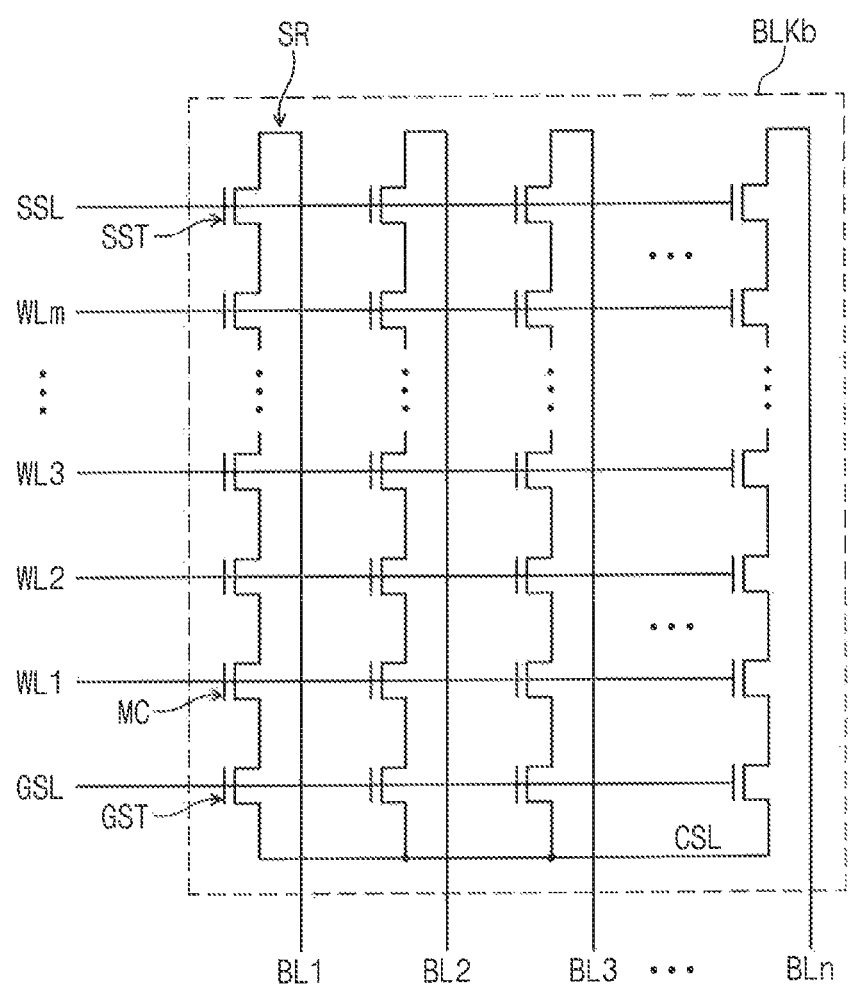
FIG. 24 is a circuit diagram illustrating a memory block according to an exemplary embodiment of the inventive concept.

FIG. 24 is a circuit diagram illustrating a memory block BLKa according to an exemplary embodiment of the inventive concept. Referring to FIG. 24, a memory block BLKa includes a plurality of strings SR, which are connected to a plurality of bit lines BL1 to BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL.

In each string SR, the string selection transistor SST is connected between the memory cells MC and a bit line BL. The string selection transistors SST of the strings SR are connected to a plurality of bit lines BL1 to BLn, respectively.

In each string SR, the plurality of memory cells MC are connected between the ground selection transistor GST and the string selection transistor SST. In each string SR, each of the plurality of memory cells MC is connected in series to another.

In the strings SR, memory cells MC positioned at the same height from the common source line CSL are connected in common to a word line. The memory cells MC of the strings SR are connected to a plurality of word lines WL1 to WLm.

Figure 25:
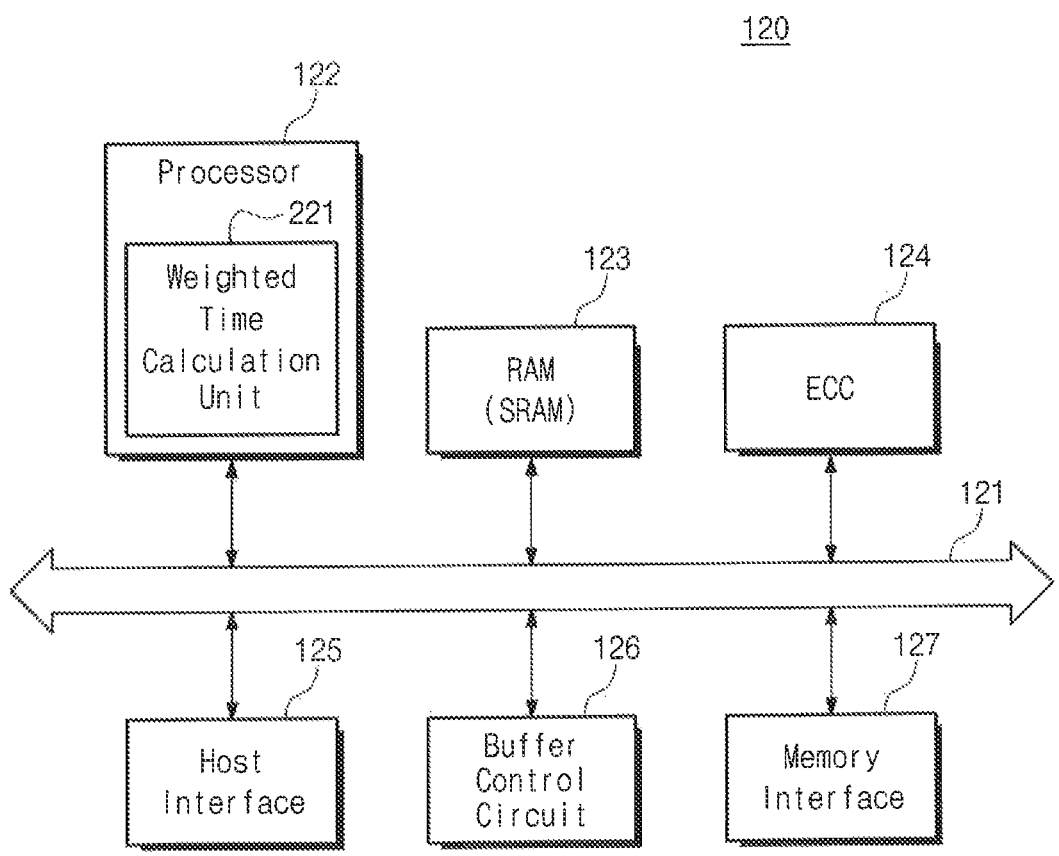
FIG. 25 is a block diagram illustrating a memory controller according to an exemplary embodiment of the inventive concept.

FIG. 25 is a block diagram illustrating a memory controller 120 according to an exemplary embodiment of the inventive concept. Referring to FIG. 25, a memory controller 120 contains a bus 121, a processor 122, a RAM 123, an ECC block 124, a host interlace 125, a buffer control circuit 126, and a memory interface 127.

The bus 121 may be configured to provide a channel among components of the memory controller 120.

The processor 122 controls an operation of the memory controller 120 and executes a logical operation. The processor 122 communicates with an external host through the host interface 125. The processor 122 stores commands or addresses received via the host interface 125 in the RAM 123. The processor 122 may store data received via the host interface 125 in the RAM 123 or may output it via the buffer control circuit 126. The processor 122 generates internal commands and addresses according to commands or addresses stored in the RAM 123 and outputs them via the memory interface 127. The processor 122 outputs data received via the buffer control circuit 126 or data stored in the RAM 123 via the memory interface 127. The processor 122 stores data received via the memory interface 127 in the RAM 123 or outputs data, which is received via the memory interface 127, via the buffer control circuit 126. The processor 122 may output data stored in the RAM 123 or output data received via the buffer control circuit 126, via the host interface 125 or via the memory interface 127. For example, the processor 122 may include a direct memory access (DMA) and output data using the DMA.

The processor 122 contains a weighted time calculation unit 221. The processor 122 manages a sensing temperature ST and a weighted time WT using the weighted time calculation unit 221 and generates a weighted time stamp WTS.

The RAM 123 is used as a work memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction based on data to be output to the memory interface 127. Data and parities may be output through the memory interface 127. The ECC block 124 corrects an error of data using data and parities that are received through the memory interface 127.

The host interface 125 communicates with the external host according to a control of the processor 122. The host interface 125 may communicate using at least one of communication protocols such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), and so on.

The buffer control circuit 126 controls the RAM 130 (refer to FIG. 1) according to a control of the processor 122. The buffer control circuit 126 writes data to the RAM 130 and reads data from the RAM 130.

The memory interface 127 is configured to communicate with a nonvolatile memory 110 (refer to FIG. 1) according to a control of the processor 122.

In an exemplary embodiment, the processor 122 controls the memory controller 120 using codes. The processor 122 may load codes from a nonvolatile memory (e.g., read only memory) that is implemented in the memory controller 120. Alternatively, the processor 122 may load codes received from the memory interface 127.

Figure 26:
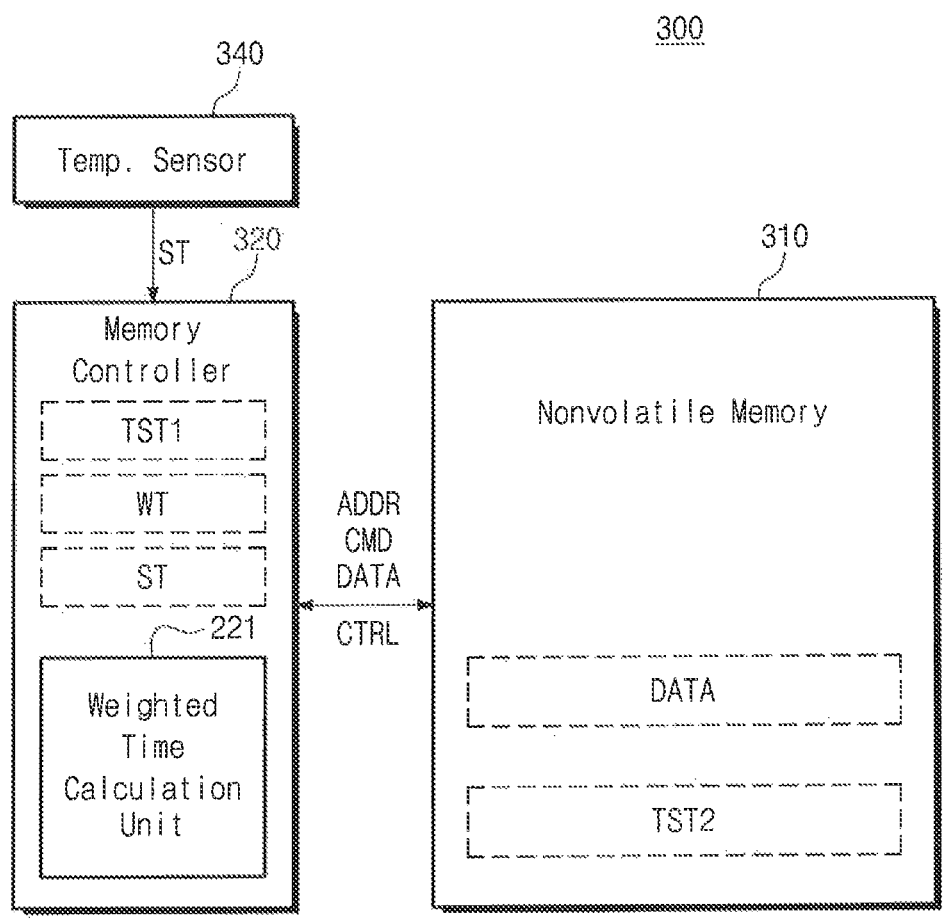
FIG. 26 is a block diagram illustrating a storage device according to an exemplary embodiment of the inventive concept.

FIG. 26 is a block diagram illustrating a storage device 300 according to an exemplary embodiment of the inventive concept. Referring to FIG. 26, a storage device 300 contains a nonvolatile memory 310, a memory controller 320, and a temperature sensor 340.

The storage device 300 does not include a RAM 130 as similar to that of FIG. 1. The memory controller 320 may manage a sensing temperature ST, a weighted time WT, and a first time stamp table TST1 using an internal memory. For example, as described with reference to FIG. 25, the memory controller 320 may manage the sensing temperature ST, weighted time WT, and first time stamp table TST1 using the internal RAM 123 of FIG. 25.

In an exemplary embodiment, in case the RAM 130 is not included in the storage device 300, a buffer control circuit 126 need not be provided in the memory controller 320.

Figure 27:
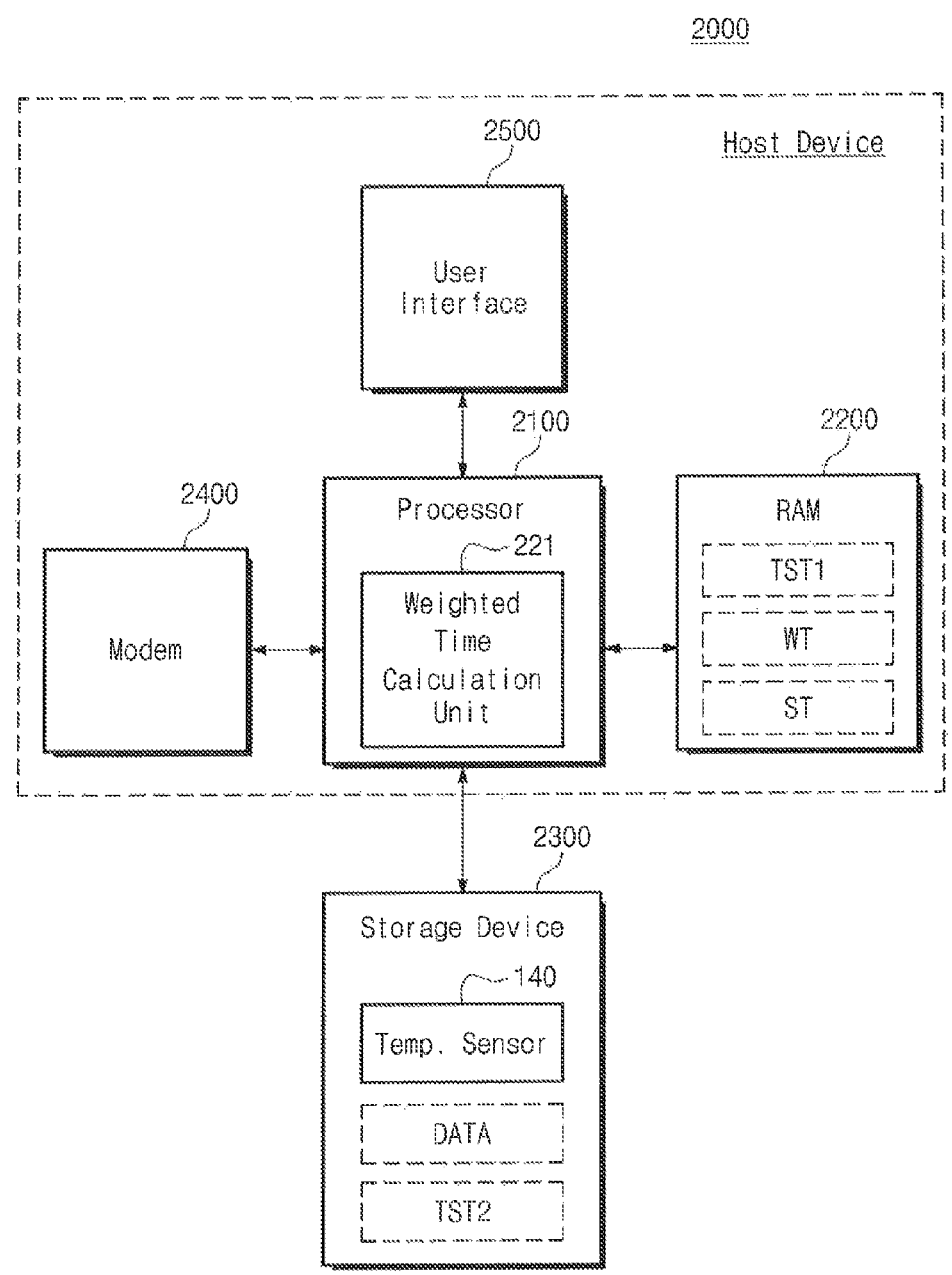
FIG. 27 is a block diagram illustrating a computing device according to an exemplary embodiment of the inventive concept.

FIG. 27 is a block diagram illustrating a computing device 2000 according to an exemplary embodiment of the inventive concept. Referring to FIG. 27, a computing device 2000 contains a processor 2100, a RAM 2200, a storage device 2300, a modem 2400, and a user interface 2500. The processor 2100, RAM 2200, modem 2400, and user interface 2500 may constitute a host device of the storage device 2300.

As compared to a computing device 1000 shown in FIG. 22, a weighted time calculation unit 221 may be included in the processor 2100 of the host device, not the storage device 2300.

The storage device 2300 includes a temperature sensor 140. The storage device stores a sensing temperature ST from the temperature sensor 140 of the storage device 2300 in the RAM 2200 of the host device. For example, the temperature sensor 140 may upload the sensing temperature ST to the RAM 2200 whenever the sensing temperature ST changes by a predetermined value. Alternatively, the temperature sensor 140 may upload the sensing temperature ST to the RAM 2200 periodically.

The sensing temperature ST may be managed according to the method described with reference to FIG. 8 except that it is stored in the RAM 2200 of the host device external to the storage device 2300.

The weighted time calculation unit 221 calculates a weighted time WT using the sensing temperature ST stored in the RAM 2200. The weighted time calculation unit 221 stores the calculated weighted time WT in the RAM 2200. The weighted time calculation unit 221 may manage the weighted time WT according to the method described with reference to FIG. 9.

The processor 2100 generates a weighted time stamp WTS based on the weighted time WT. The weighted time stamp WTS may be registered in a first time stamp table TST1. The first time stamp table TST1 may be managed in the RAM 2200 and may be stored in the storage device 2300 as a second time stamp table TST2.

Figure 28:
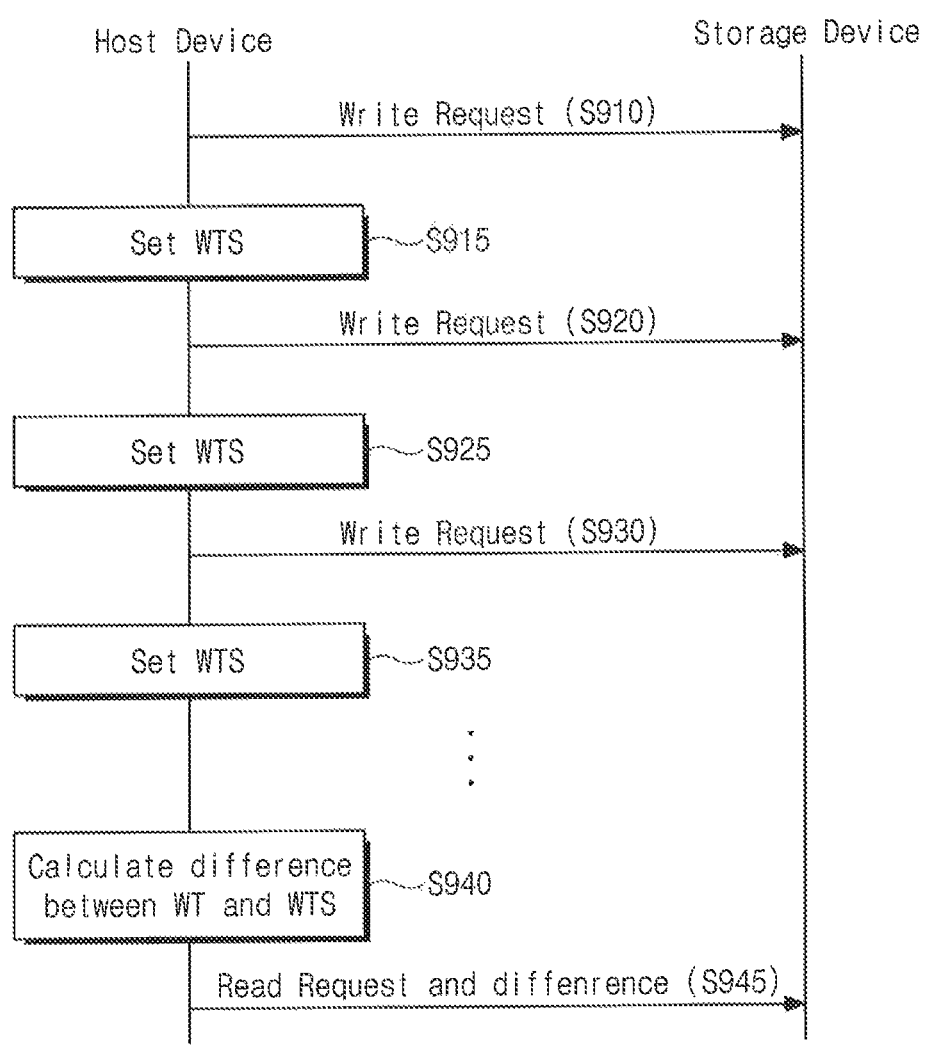
FIG. 28 is a flow chart showing an operating method of a storage device according to an exemplary embodiment of the inventive concept.

FIG. 28 is a flow chart showing an operating method of a storage device 2000 according to an exemplary embodiment of the inventive concept. Referring to FIGS. 27 and 28, in step S910, a host device issues a first write request to a storage device 2300. In step S915, the host device sets a weighted time stamp WTS corresponding to the transmitted first write request. The weighted time stamp WTS may be registered in a first time stamp table TST1.

In step S920, the host device issues a second write request to the storage device 2300. In step S925, the host device sets a weighted time stamp WTS corresponding to the transmitted second write request. The weighted time stamp WTS may be registered in the first time stamp table TST1.

In step S930, the host device issues a third write request to the storage device 2300. In step S925, the host device sets a weighted time stamp WTS corresponding to the transmitted third write request. The weighted time stamp WTS may be registered in the first time stamp table TST1.

In step S940, the host device calculates a difference between the weighted time WT and the weighted time stamp WTS. For example, the host device may calculate a difference between the weighted time WT and the weighted time stamp WTS associated with data to be read when reading data stored in the storage device 2300.

In step S945, the host device transmits a read request and the difference to the storage device 2300. For example, the host device may provide the storage device 2300 with the difference or information obtained by processing the difference. The information obtained by processing the difference may include a read voltage level that is adjusted based on the difference.

The storage device 2300 performs a read operation based on a read request, the difference, or the information obtained by processing the difference. For example, the storage device 2300 may adjust a read voltage level based on the difference or the information obtained by processing the difference and may perform a read operation using the adjusted read voltage level. For example, the storage device 2300 may receive an adjusted read voltage level from the host device and may perform a read operation using the adjusted read voltage level.

As described above, the storage device 2300 includes a temperature sensor 140 and provides a host device with a sensing temperature ST obtained via the temperature sensor 140. The host device calculates a weighted time WT using the sensing temperature ST, generates a weighted time stamp WTS using the weighted time WT, and manages the weighted time stamp WTS using a time stamp table TST. For example, the host device may perform some of functions which are described as being performed in a memory controller 120 in FIGS. 1 to 26.

The storage device 2300 provides the host device with the sensing temperature ST and performs a read and a write operation according to a request of the host device. The storage device 2300 adjusts a read voltage level according to a request of the host device. In this case, the storage device 2300 does not generate or manage a weighted time WT and a weighted time stamp WTS.

Figure 29:
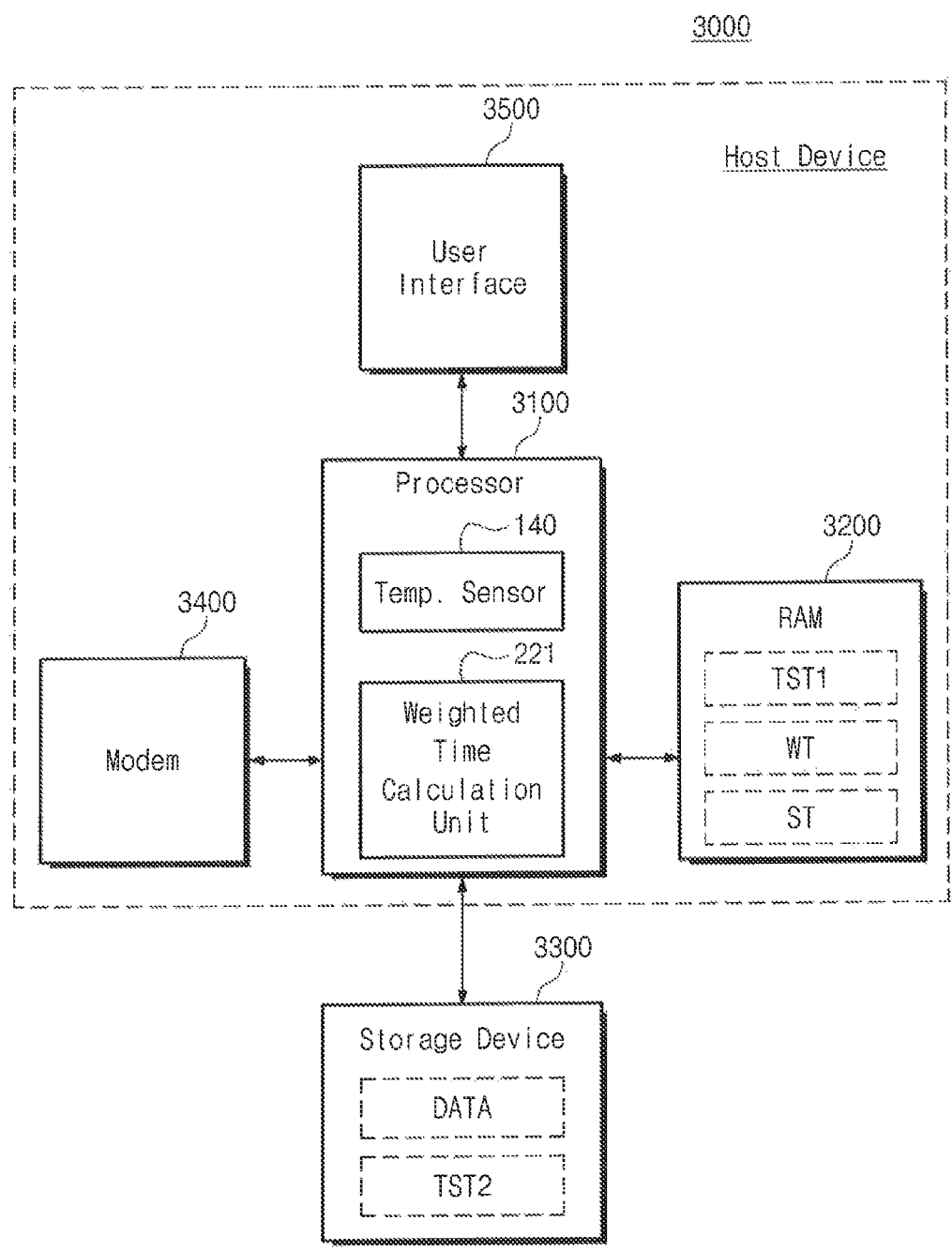
FIG. 29 is a block diagram illustrating a computing device according to an exemplary embodiment of the inventive concept.

FIG. 29 is a block diagram illustrating a computing device 3000 according to an exemplary embodiment of the inventive concept. Referring to FIG. 29, a computing device 3000 contains a processor 3100, a RAM 3200, a storage device 3300, a modem 3400, and a user interface 3500. The processor 3100, RAM 3200, modem 3400, and user interface 3500 may constitute a host device of the storage device 3300.

As compared to a computing device 2000 shown in FIG. 27, a temperature sensor 140 may be included in the processor 3100 of the host device, not the storage device 3300.

The host device may generate and manage a sensing temperature ST, a weighted time WT, and a weighted time stamp WTS independently of the storage device 3300. The host device may adjust a read voltage level of the storage device 3300, based on the sensing temperature ST, the weighted time WT, and the weighted time stamp WTS.

The storage device 3300 performs a read and a write operation according to a request of the host device. The storage device 3300 adjusts a read voltage level according to the request of the host device. The storage device 3300 does not generate or manage a weighted time WT and a weighted time stamp WTS.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An operating method of a storage device which includes a nonvolatile memory and a memory controller configured to control the nonvolatile memory, the operating method comprising:

detecting temperature;

calculating a current weighted time using the temperature; and reading data from the nonvolatile memory using a read voltage level which is adjusted based on the current weighted time, wherein the temperature is periodically detected at a first period, and the calculating of the current weighted time is periodically performed at a second period based on the detected temperature.

2. The operating method of claim 1, wherein the calculating of the current weighted time comprises:

calculating a weighted elapse time by adjusting a time of the second period based on the detected temperature; and calculating the current weighted time by adding the weighted elapse time to a previous weighted time.

3. The operating method of claim 2, wherein the weighted elapse time increases in proportion to an increase in the detected temperature.

4. The operating method of claim 2, wherein the weighted elapse time increases in proportion to an increase in the time of the second period by which the current weighted time is periodically calculated.

5. The operating method of claim 2, wherein the time of the second period is further adjusted using a number of program-erase cycles performed on the storage device, and wherein the weighted elapse time increases in proportion to an increase in the number of program-erase cycles.

6. The operating method of claim 5, wherein the number of program-erase cycles is an average number of performing erase operations on each of a plurality of memory blocks of the nonvolatile memory.

7. The operating method of claim 2, wherein the second period by which the current weighted time is calculated is shorter than the first period by which the temperature is detected.

8. The operating method of claim 1, wherein the temperature is detected using an internal temperature sensor of the storage device or an external temperature sensor of the storage device.

9. The operating method of claim 1, further comprising:
writing the data to the nonvolatile memory; and
registering a weighted time which is associated with the data written to the nonvolatile memory as a weighted time stamp of the data.

10. The operating method of claim 9, further comprises:
calculating a difference between the weighted time stamp of the data and the current weighted time of the data, wherein the read voltage level is adjusted based on the calculated difference.

11. The operating method of claim 9, further comprising:
if power is off and then supplied,
detecting an optimal read voltage level for reading the data;
calculating a difference between the optimal read voltage level and a default read voltage level;
and calculating a weighted time using the difference, wherein the weighted time is used as the previous weighted time.

12. The operating method of claim 9, wherein the weighted time stamp includes a physical address information of the nonvolatile memory where the data is written.

13. A storage device comprising:
a temperature sensor;
a nonvolatile memory; and
a memory controller configured to control the nonvolatile memory,
wherein the memory controller is configured to calculate a current weighted time based on a variation in a temperature detected via the temperature sensor and reads data from the nonvolatile memory using a read voltage level adjusted according to the current weighted time, and
wherein the memory controller is further configured to periodically detects the temperature at a first period, and to periodically calculates the current weighted time at a second period based on the detected temperature.

14. The storage device of claim 13, further comprising:
a random access memory,
wherein the memory controller is further configured to periodically stores the detected temperature in the random access memory.

15. The storage device of claim 14, wherein the memory controller writes the data to the nonvolatile memory, reads a weighted time from the random access memory, and registers the weighted time as a weighted time stamp of the data.

16. The storage device of claim 15, wherein the weighted time stamp of the data written to the nonvolatile memory are managed in the random access memory as a time stamp table.

17. The storage device of claim 16, wherein the time stamp table is further stored in the nonvolatile memory.

18. The storage device of claim 15, wherein the memory controller further configured to:
read the current weighted time from the random access memory; and
calculate a difference between the weighted time stamp and the current weighted time,
wherein the read voltage level is adjusted according to the calculated difference.

19. The storage device of claim 13, wherein the nonvolatile memory includes vertically stacked memory cells.

20. The storage device of claim 19, wherein each memory cell is a charge trap type.

* * * * *